US006845262B2

(12) United States Patent
Albert et al.

(10) Patent No.: US 6,845,262 B2
(45) Date of Patent: Jan. 18, 2005

(54) LOW-FIELD MRI

(75) Inventors: Mitchell S. Albert, Boston, MA (US); Dilip Balamore, Shoreham, NY (US); Arvind K. Venkatesh, Boston, MA (US)

(73) Assignee: The Brigham and Women's Hospital, Inc., Boston, MA (US)

( * ) Notice: Subject to any disclaimer, the term of this patent is extended or adjusted under 35 U.S.C. 154(b) by 521 days.

(21) Appl. No.: 09/818,822

(22) Filed: Mar. 27, 2001

(65) Prior Publication Data

US 2001/0037063 A1 Nov. 1, 2001

Related U.S. Application Data

(60) Provisional application No. 60/193,041, filed on Mar. 29, 2000.

(51) Int. Cl.[7] ............................. G01V 3/00; A61B 5/05
(52) U.S. Cl. ...................................... 600/420; 324/307
(58) Field of Search ................................ 600/420, 421, 600/422, 423, 407, 410, 411, 419, 431; 250/302, 303; 424/9.3, 9.323, 306; 324/307, 308, 309

(56) References Cited

U.S. PATENT DOCUMENTS

| 5,471,981 A | * | 12/1995 | Wiggins et al. ............. 600/309 |
| 5,545,396 A | | 8/1996 | Albert et al. .................. 424/93 |
| 5,744,958 A | * | 4/1998 | Werne .......................... 324/318 |
| 5,785,953 A | | 7/1998 | Albert et al. .................. 424/93 |
| 5,789,921 A | | 8/1998 | Albert et al. ................ 324/300 |
| 5,859,922 A | * | 1/1999 | Hoffmann .................... 382/128 |
| 5,936,404 A | | 8/1999 | Ladebeck et al. ............ 324/300 |
| 6,426,058 B1 | * | 7/2002 | Pines et al. ................... 424/9.3 |
| 6,566,875 B1 | * | 5/2003 | Hasson et al. ............... 324/309 |

FOREIGN PATENT DOCUMENTS

| WO | WO 97/37239 | 10/1997 |
| WO | WO 98/30918 | 7/1998 |
| WO | WO 99/47940 | 9/1999 |
| WO | WO 99/52428 | 10/1999 |
| WO | WO 99/53332 | 10/1999 |

OTHER PUBLICATIONS

Wong, et al., "A System for Low Field Imaging of Laser–Polarized Noble Gas", Journal of Magnetic Resonance 141, 217–227 (1999).

Albert, et al, "Development of Hyperpolarized Noble Gas MRI", Nuclear Instruments and Methods in Physics Research, A 402 (1998) 441–453.

Ebert, et al., "Nuclear Magnetic Resonance Imaging with Hyperpolarised Helium–3", 347(9011) The Lancet 1297–1299 (1996).

* cited by examiner

*Primary Examiner*—Daniel Robinson
(74) *Attorney, Agent, or Firm*—Mintz, Levin

(57) ABSTRACT

A method of imaging using magnetic resonance includes administering hyperpolarized noble gas to a subject in a region to be imaged, applying a magnetic field of a magnitude between about 0.0001 Tesla and about 0.1 Tesla to the subject at least in the region of the subject to be imaged, detecting a spatial distribution of magnetic resonance signals of the hyperpolarized noble gas in the subject, and producing a representation of the spatial distribution.

40 Claims, 13 Drawing Sheets

LOW-FIELD MRI

CROSS-REFERENCE TO RELATED APPLICATIONS

This application claims the benefit of U.S. Provisional Application No. 60/193,041 entitled "Low-Field MRI," filed Mar. 29, 2000.

STATEMENT AS TO FEDERALLY SPONSORED RESEARCH

This invention was made with U.S. Government support under National Science Foundation grant No. 9813777. The government has certain rights in the invention.

FIELD OF THE INVENTION

This invention relates to magnetic resonance imaging and more particularly to magnetic resonance imaging in low-strength magnetic fields.

BACKGROUND OF THE INVENTION

Magnetic Resonance Imaging (MRI) measures the presence of polarized particles within objects and processes these measurements into images showing the location and concentrations of the particles. A magnetic field is applied to an object to align the particles within the object along a direction of the magnetic field. Once the particles are aligned, the object is subjected to a radio frequency (RF) pulse with or without using magnetic field gradients. This pulse deflects the particles from their axis. In returning to their axes (i.e., during relaxation), the particles emit a signal that can be measured by magnetic field receptors, such as coils. The detected signals are used to produce images of the object.

Some noble gases are both effective anesthetic agents and suitable for use in MRI systems. One noble gas with known anesthetic properties that has been approved for use in humans is Xenon. In addition, $^{129}$Xenon ($^{129}$Xe) has non-zero nuclear spin, making 129Xenon theoretically suited to MRI. The small magnetic moment, however, of $^{129}$Xenon makes it, in its normal state, impractical for use in MRI. Helium, in particular $^3$Helium ($^3$He) is another noble gas adapted for use in MRI.

Both $^{129}$Xenon and $^3$He have been shown to be practical for MRI use when hyperpolarized. Hyperpolarizing $^{129}$Xenon or $^3$He increases the nuclear spin and enhances the signal produced during relaxation compared to when these gases are not hyperpolarized. These gases can be hyperpolarized ex vivo using, e.g., well-known optical pumping techniques, and have relatively long relaxation times in vivo, enhancing their usefulness for in vivo MRI.

SUMMARY OF THE INVENTION

In general, in one aspect, the invention provides a method of imaging using magnetic resonance. The method includes administering hyperpolarized noble gas to a subject in a region to be imaged, applying a magnetic field of a magnitude between about 0.0001 Tesla and about 0.1 Tesla to the subject at least in the region of the subject to be imaged, detecting a spatial distribution of magnetic resonance signals of the hyperpolarized noble gas in the subject, and producing a representation of the spatial distribution.

Various aspects of the invention may provide one or more of the following advantages. In vivo MRI can be performed using low magnetic fields on the order of 0.0001 T–0.1 T (e.g., less than about 0.017 T). Fields lower than 0.0001 T may also be possible. Lungs, sinuses, colons and other voids in a body, as well as blood vasculature, lung tissues, the heart, the kidneys, and the brain can be imaged using hyperpolarized gas MRI. Lung gas can be imaged, e.g., for diagnosis of emphysema and studies of lung structure and respiratory function and diagnosis of pulmonary function. Lipid structures, e.g., of the brain, can be imaged, e.g., for diagnosis and staging of multiple sclerosis, measuring/monitoring white matter diffusion, and brain function research. Blood flow to tissue can be measured, e.g., for stroke and ischemia diagnosis, and for brain and cardiopulmonary research. MRI can be performed with small, lightweight, and/or portable apparatus. MRI apparatus may be provided in mobile vehicles, such as motor vehicles (e.g., cars or vans), aircraft, underwater vehicles, and/or spacecraft. Novel information may be acquired about physiological structure and function during in-space flights and in terrestrial gravity. Clinical diagnosis of pathology may be improved. Superconducting magnets can be eliminated from MRI systems. Spatial resolutions of about 0.1 mm may be provided. MRI images may be obtained with an open apparatus, not requiring a subject to be placed within a magnet bore. MRI can be achieved using a planar magnet, a C-shaped magnet, a solenoid, a Helmholtz magnet, or a superconducting magnet. MRI can be performed without significantly negatively impacting or affecting, metal, magnetic, or electrical items in or near a subject to be imaged. Imaging can be performed in locations not previously typically possible such as emergency rooms or operating rooms. Susceptibility artifact may be decreased proportional to decreases in the magnetic field used for MRI. Imaging distortions and line broadening due to heterogeneous magnetic susceptibilities can be reduced. Decoherence due to magnetic susceptibility can be reduced relative to high-field systems. Deeper skin depth can be achieved for penetration into, and imaging of, conducting materials. Room shielding can be eliminated. Inanimate objects can be imaged, e.g., for rock porosity measurements (e.g., for oil well logging) and diffusion measurements.

These and other advantages of the invention, along with the invention itself will be more fully understood after a review of the following drawings, detailed description, and claims.

DETAILED DESCRIPTION OF PREFERRED EMBODIMENTS

Embodiments of the invention provide techniques for implementing MRI using hyperpolarized noble gases and a low applied magnetic field on the order of 0.0001 T–0.1 T. It may be possible to use even lower field strengths than 0.0001 T with embodiments of the invention. As used herein, "low field" includes fields that may be referred to by some as "low field," "very-low field," and "ultra-low field." Embodiments of the invention provide techniques for imaging animal and human subjects as well as in inanimate subjects. For example, embodiments of the invention provide techniques for imaging specific items such as lung and lung-gas, lipid structures in the brain, blood flow to tissue, and rock samples (e.g., for geophysical imaging such as for use in oil well logging). Numerous other applications are also possible, including imaging plastics, foams, pipes, casts, ceramics, liquids (especially with $^{129}$Xe as it is soluble in liquids), aerosol delivery analysis (e.g., for asthma inhalers), and numerous noninvasive void analysis applications, in addition to those mentioned.

Figure 1:
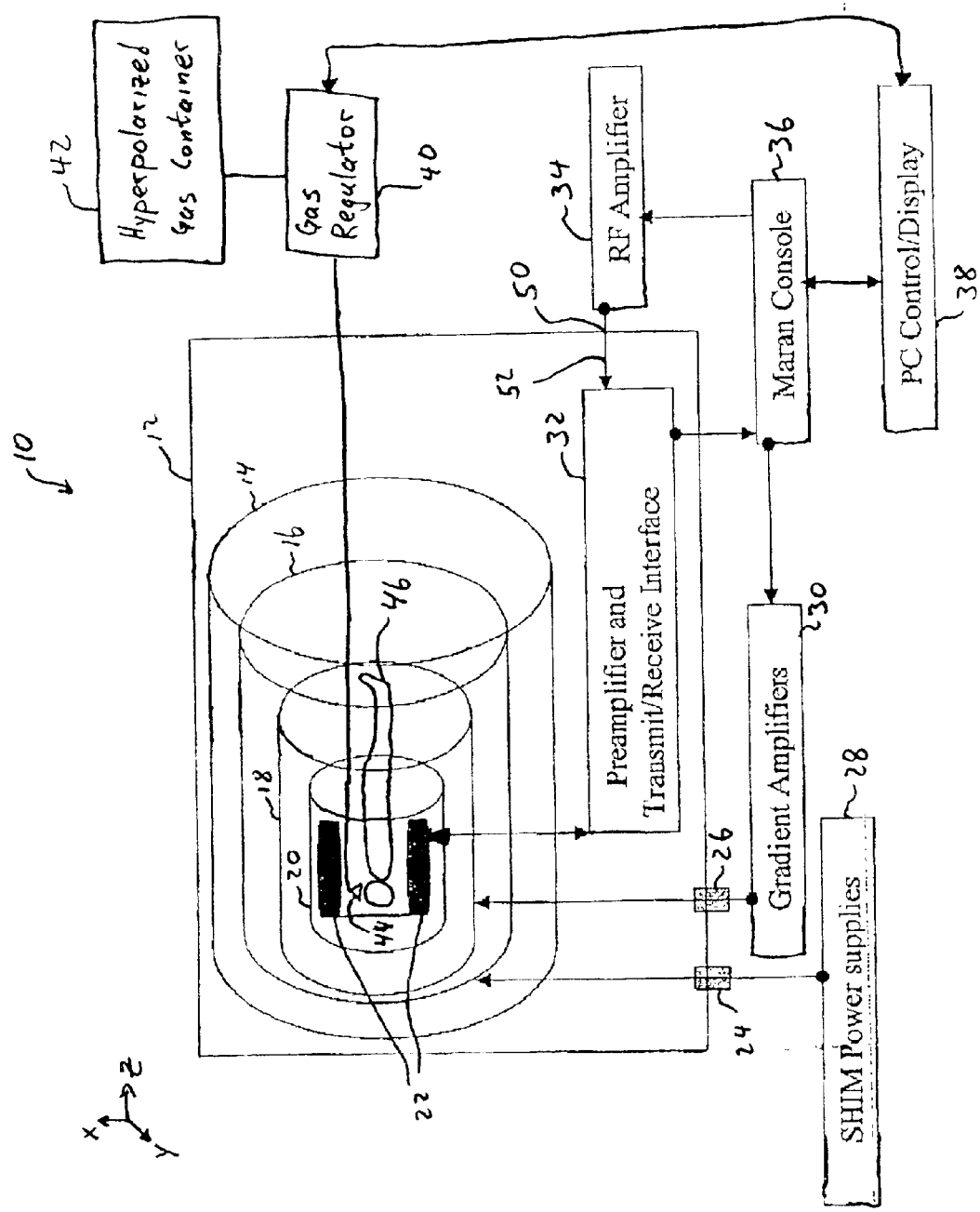
FIG. 1 is a schematic, partial-block diagram of an MRI system according to the invention.

Referring to FIG. 1, a low-field MRI system 10 includes a shielded room 12, a magnet 14, room temperature electromagnet shims 16, gradient coils 18, a coil shield 20, a Radio Frequency (RF) coil 22, 60 Hz filters 24, low-pass gradient filters 26, shim power supplies 28, gradient amplifiers 30, a pre-amplifier and transmit/receive (T/R) interface 32, an RF amplifier 34, a console 36, a PC control/display 38, a gas regulator 40, a hyperpolarized gas container 42, and an inhalation mask 44. A subject 46 such as the person shown can be placed inside the magnet 14, room temperature shim 16, gradient coil 18, coil shield 20, and RF coil 22. These elements are configured to be placed inside of each other as shown to receive the person within bores of the respective elements as shown. The magnet 14 and the elements nested therein, may be centrally located within the shielded magnetic room 12, although shown off center in FIG. 1.

The magnetic room 12 is enclosed in an electrically conductive border. For example, the magnetic room 12 can be enclosed in soft iron one inch thick. Preferably, such material encloses the entire magnetic room 12. Discontinuities, such as windows, can be covered with electrical conductors such as one-inch thick iron and electrically connected to the other portions of the magnetic room 12. Other arrangements for covering discontinuities are possible, such as covering the discontinuities with a sheet of one-millimeter thick copper. The conductive border (shielding) of the room 12 may be removed at low magnetic fields, although a Faraday cage to keep electrostatic noise away from the RF coil 22 may be used.

The magnet 14 is configured to provide at least magnetic fields ($B_0$) of about 0.0001 Tesla (T) to about 0.1 T. The magnet 14 can be e.g., an IBI/MIT/BWH superconducting magnet capable of producing fields on the order of 1.5 T, but set to a field strength in the range 0.0001–0.1 T (10–1000 Gauss (G)). Super conducting coils of the magnet 14 are kept cooled with liquid Helium placed in a duwer of liquid nitrogen. The liquid Helium and liquid nitrogen are stored in containers (not shown) each having cold heads to reduce cyrogen burnoff. The magnet 14 is configured to produce a longitudinal magnetic field within the subject 46 disposed inside the system 10 as shown. Signal to noise ration(SNR) at fields of about 0.0001 T to 0.1 T varies approximately $B_0^{3/4}$ instead of as $B_0^{7/4}$ as is the case at fields of above 0.1 T. Also, the predominant noise at fields of about 0.0001 T to 0.1 T is due to system electronics while it is due to the subject 46 at fields above about 0.1 T.

The room temperature shims 16 are disposed, configured, and arranged to help insure that the magnetic field provided by the magnet 14 in the region of the subject 46 to be imaged is homogeneous. These shims 16 are disposed three dimensionally, in x, y and orthogonal directions. The shims 16 are connected to the shim power supplies 28. The shim power supplies 28 are three HP 6253 A dual DC power supplies connected to the x, y and z shims 16 respectfully.

The shim power supplies 28 can be controlled to vary the amount of energy provided to the respective shims 16 to help ensure the homogeneity of the magnetic field produced by the magnet 14 in the region to be imaged. The shims 16 are connected to the shim power supplies 28 by a cable and the 60 Hz filter. The 60 Hz filter is positioned at the point were the cable connecting the shims 16 and the shim power supplies 28 crosses into the shielded magnetic room 12. The 60 Hz filters 24 include multiple power line interference reduction filters. These filters 24 help reduce the interference otherwise produced by the cable connecting the shims 16 and the shim power supplies 28.

The gradient coils 18 are disposed within the shims 16 as shown and are configured to produce gradient magnetic fields in the subject 46. The gradient fields produced by the gradient coils 18 change the Larmour frequency of hyperpolarized molecules to help isolate portions of a region of the subject 46 to be imaged to thereby obtain the image.

The gradient coils 18 are connected through the low-pass gradient filters 26 to the gradient amplifiers 30. The low-pass gradient filters 26 have high inductance value, that help to reduce noise at frequencies higher than the imaging frequencies, described below. The low-pass filters 26 include series-connected inductors formed of twenty-turn, Gauge 4 cable wound on a 10 cm diameter cylinder, each providing an inductance of approximately 16 H. A capacitance of approximately 100 pf was connected to ground to form a simple LC low-pass filter.

The gradient amplifiers 30 are configured to drive the gradient coils 18 through the low-pass gradient filters 26 to produce the desired gradients in the subject 46. Here, the gradient amplifiers 30 are three Techron 8604 amplifiers made by Techron of Elkhart, Indiana, configured to drive x, y, and z gradients in the subject 46. These amplifiers 30 can drive 120 amperes of current through the gradient coils 18. The gradient amplifiers 30 and the gradient coils 18 are configured such that with a current output from the gradient amplifiers 30 of 100 amperes, gradients of 1 Gauss/cm are produced. The gradient amplifiers 30 can produce smaller gradient strengths in the gradient coils 18, such as 0.5 g/cm and 0.2 g/cm. The gradient amplifiers 30 receive control signals from the console 36 to control the energy, e.g., the current sent to the gradient coils 18.

The gradient amplifiers 30 are configured to produce smoothly varying shaped gradient pulses in response to control signals from the control/display 38 as described below. It has been found that using smoothly varying shaped gradient pulses instead of sharp, square pulses, reduces noise at the imaging frequencies of 175.6 KHz for Xenon and 486.48 KHz for Helium.

Figure 2:
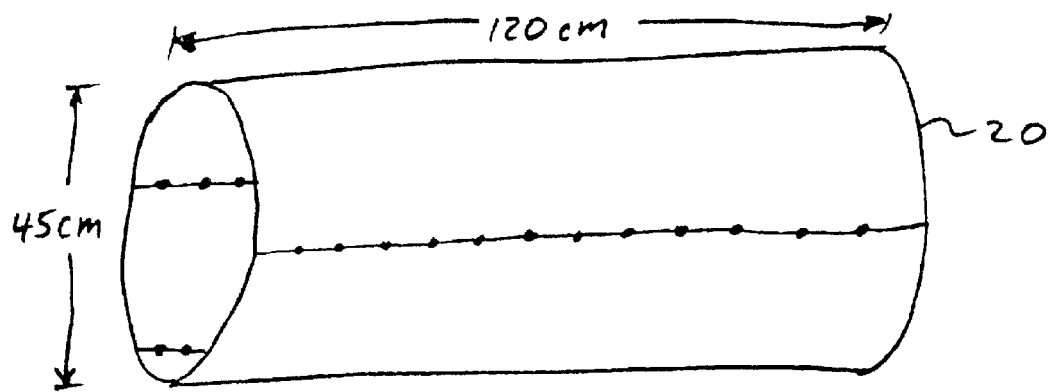
FIG. 2 is a perspective view of a shield used in the system of FIG. 1.

Referring also to FIG. 2, the shield 20 is disposed within the bore of the magnet 14 and around the subject 46. The shield 20 is an electrically conductive material and is sized and configured to contain the subject, or at least a portion of the subject to be imaged, and to shield electromagnetic noise from the region of the subject to be imaged. Here, the shield 20 is a copper sheet 0.05 mm thick with a cylindrical shape having a length of 120 cm and a diameter of 45 cm. The shield 20 comprises three copper sheets overlapped and soldered at their respective ends and along their respective lengths approximately every 10 cm. Openings or slits between soldered points can help reduce eddy currents, e.g., induced when gradients are applied. Capacitors connect the sheets near ends of the shield 20 to help improve SNR.

Figure 3:
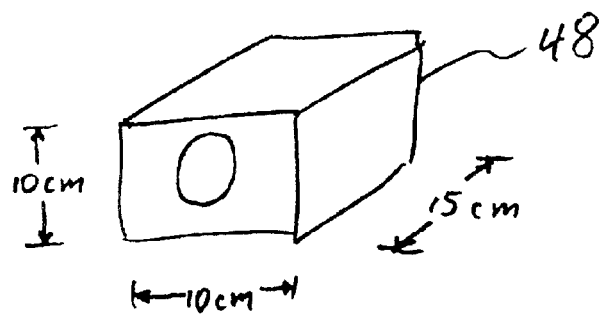
FIG. 3 is a perspective view of a shield box that may be used in the system of FIG. 1.

Referring to FIG. 3, for small subjects, such as small animals, an electrically conductive shield box 48 in addition to the shield 20 is provided for containing the small subject within the shield 20 (FIG. 2) and for reducing electrostatic noise. The shield box 48 is sized to contain a volume approximately equal to, but larger than, a volume contained by the RF coil 22 (although the RF coil 22 does not fully enclose a volume, as shown, the RF coil 22 partially contains a volume defined by the coil's perimeter, that can be enclosed by connecting the coil's perimeter with walls). The shield box 48 is also 0.05 mm thick copper, but has a rectangular shape having a length of 15 cm, a width of 10 cm, and a height of 10 cm. The shield(s) 20, 48 is (are) grounded to the magnet 14. This grounding also helps reduce the noise detected by the console 36, as described below. A description of shielding techniques can be found in "Shielding of Low-Frequency Magnetic Interference in Weak-Field MRI by a Single-Layer Cylindrical Coil," Planinsic, Gorazd, Journal of Magnetic Resonance, 126, 30–38 (1997).

Referring to FIG. 1, the RF coil 22 is disposed about the subject 46 as shown and is configured to provide RF pulses to the subject. Here, the RF coil is a low-field RF dual-surface coil (arguably a Helmholtz coil). A description of such coils can be found in "Transverse Low-Field RF Coils in MRI," Claasen-Vujcic, et al., MRM 36:111–116 (1996). The RF coil 22 comprises LITZ wire (although other types of wire may be used) wound on a cylinder having a diameter of 25 inches. The LITZ wire can be obtained from MWS Wire Industries of Westlake Village, Calif. For example, either 50/41 polyurethane unserved LITZ 30TPF (50 strands of 41-gauge wire with polyurethane insulation and 30 turns/sq foot) or 50/38 SSPTN=180 C unserved LITZ 12 TPF can be used. For human subjects, the RF coil 22 can be a Helmholtz with 20 turns (although other numbers, e.g., 100 or 200, are possible) on each of two rings connected in series. For animal subjects, about 100 turns on a cylinder having a diameter of about 4.5 cm can be used. LITZ wires typically have lower resistance than conventional magnetic wires.

The RF coil 22 is configured to produce a reduced amount of noise compared with typical configurations. The coil windings are configured in a non-overlapping cylindrical arrangement that has been found to be significantly better than winding on a pseudoplane or in an overlapping manner. It may be further useful to provide a space between the wire turns. The number of turns in the coil 22 can be adjusted to achieve a desired compromise between increasing signal pickup and increasing coil losses, which both occur by increasing the number of turns. Additionally, the number of turns may be adjusted to help tune the frequency and/or the impedance of the coil 22. The above-noted numbers of turns for human and animal subjects has been found to provide good results. The RF coil 22 is designed at low frequency using high inductance, and careful tuning and matching, to achieve a high quality factor (Q), as signal to noise ratio (SNR) is proportional to Q. To help increase the Q, the RF coil 22 can be a high temperature superconducting (HTS) coil.

The RF coil 22 is tuned and matched according the desired use. The RF coil 22 is tuned and matched outside the bore of the magnet 14 (although tuning outside the bore is not required) with the subject 46 in the RF coil 22. This tuning and matching may result in the coil winding extending beyond the bore of the magnet 14. This is acceptable, e.g., due to the long wavelength of the RF signal combined with low-field RF coil 22. An automatic tuning and matching circuit can be implemented with digitially-switchable compacitor/inductor arrays. The longer wavelengths involved with low-field RF signals and the reduced interference from stray compacitances in the system 10 help the design task for the automatic tuning and matching circuit.

Other configurations for the RF coil 22 can lead to further improvements in reducing noise and increasing SNR. The same RF coil 22 is configured to be used in the system 10 for both transmission and receipt of the signals. Using separate transmit and receive coils can further increase the SNR. Additionally, HTS coils can yield an improved SNR at low frequencies where coil noise is significant, if not the dominant source of noise. The improvement in SNR is especially true for small regions to be imaged using small diameter coils 22.

The PC control/display 38 provides a user interface and centralized control for other portions of the system 10. The control/display 38 can be an IBM-compatible personal computer such as a computer containing an Intel® Penitum® 450 MHz microprocessor, a monitor, a keyboard, a mouse, memory, and disk drives. The control/display 38 is configured to control the operation of the system 10, and in particular the processing of signals to and from the subject 46 and the gas regulator 40. For example, the control/display 38 controls switching of the RF coil 22 between transmit and receive modes for transmitting RF pulses and receiving signals indicative of the excited hyperpolarized gas in the subject 46. This includes spectral analyses of signals to isolate portions of detected signals according to frequencies of the portions to produce images. Received signals can be processed by the control/display 38, e.g., by being convolved, arranged, Fourier transformed, and/or frequency filtered.

The control/display 38 can regulate the encoding strategy of imaging using the system 10. In human experiments, the control/display 38 can effect multishot (multiple RF pulses) gradient echo techniques with centric encoding. In this case, the center of the k-space (smaller gradients and larger signal) is acquired at the beginning of the imaging process before the hyperpolarized gas can significantly depolarize due to the $T_1$ relaxation. Alternatively, the control/display 38 can effect multiple-echo single-shot techniques such as Rapid Acquisition with Relaxation Enhancement (RARE) or Echo Planar Imaging (EPI). Such techniques can provide higher (e.g., 5–6 times higher) SNR than gradient echo techniques.

Different types of imaging can be accomplished by the control/display 38. For example, the control/display 38 is configured for dynamic imaging to provide moving pictures, e.g., of lungs inflating/deflating. Additionally, the control/display 38 is configured for adaptive imaging, e.g., to refine the focus of imaging.

The control/display 38 is configured to provide a "navigator" to monitor polarization. The control/display 38 can effect an RF pulse (e.g., only FID with no gradients) with a small flip angle to the subject 46 and can use a signal detected in response to the pulse to determine the amount of polarization of the hyperpolarized gas in the subject 46. The control/display 38 can also use the navigator to determine load (impedance) characteristics of the subject 46. Also, the control/display 38 and can use multiple navigators to determine the flip angle of pulses and adapt the flip angle (e.g., in real time during an imaging process). The control/display 38 can use multiple navigators to measure the longitudinal relaxation time T1, or spin-spin relaxation time $T_2$ or $T_2^*$, and to adapt sequence parameters accordingly (e.g., in real time during an imaging process).

Figure 8:
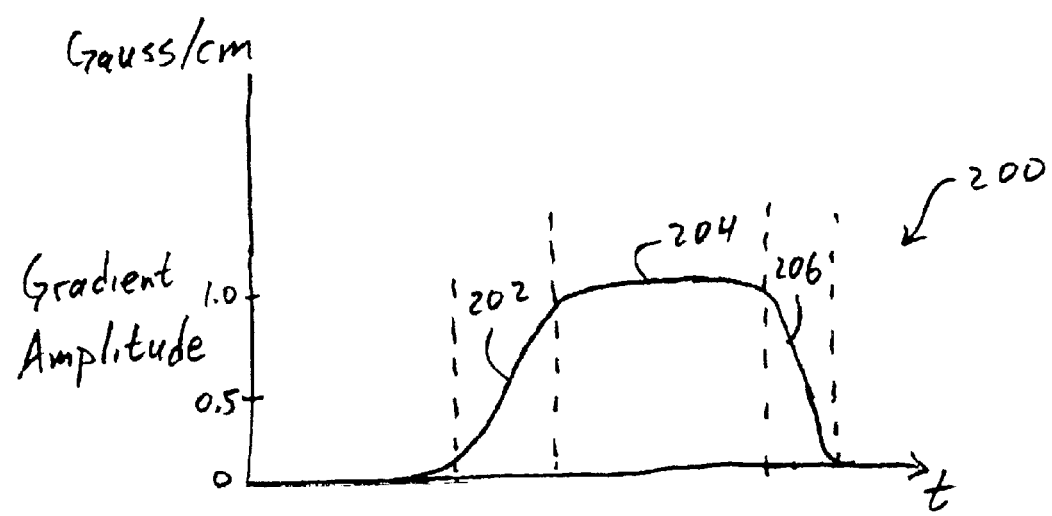
FIG. 8 is a diagram illustrating gradient signal magnitude over time.

The control/display 38 is also configured to effect a smoothly varying, sloped gradient from the gradient amplifiers. Referring to FIG. 8, a gradient 200 includes a smooth, gradual rise 202, a flat portion 204, and a smooth, gradual decline 206. The rise 202 and the decline 206 both last about 1.5–2 ms, and the flat portion lasts about 6–7 ms in duration, for a total gradient time of approximately 10 ms. The flat portion 204 has a magnitude of about 1 Gauss/cm. Using a smoothly-varying gradient instead of a square-wave gradient helps reduce noise at the imaging frequencies (about 176 KHz for $^{129}$Xenon and about 486 KHz for $^3$Helium) that can result from harmonics of square-wave gradients.

The gas regulator 40 provides hyperpolarized gas from the gas container 42 to the subject 46. In response to signals from the control/display 38, the gas regulator 40 can transfer hyperpolarized gas, such as $^{129}$Xe or $^3$He, from the container 42 to the inhalation mask 44. The mask 44 is positioned to facilitate inhalation of the gas by the subject 46, e.g., by placing the mask 44 over the subject's mouth and/or nose and in contact with the subject's face, e.g., with an elastic band wrapped around the subject's head. The gas regulator 40 acts as a valve between the container 42 and the mask 44 under the control of the control/display 38. The container 42 is configured to store $^{129}$Xe or $^3$He gas indefinitely, although the gases will not necessarily remain hyperpolarized indefinitely. The gases can be hyperpolarized externally in a device, not shown, such as a laser pumping device as is known. Alternatively, the container 42 can include the device for hyperpolarizing the gases.

The console 36 is configured to receive control signals from the control/display 38 and to transmit signals to the control/display 38 representing signals detected by the RF coil 22 from the subject 46. The console 36 is a MARAN console made by Resonance Instruments of Witney, United Kingdom. In response to control signals from the control/display 38, the console 36 can send gradient control signals to the gradient amplifiers 30 to control the gradients produced by the gradient amplifiers 30, and in turn the gradient coils 18. The console 36 is also configured, in response to signals from the control/display 38, to produce RF signals and to transmit these signals to the RF amplifier 34 for transmission to the RF coil 22. The console 36 includes a signal generator capable of producing signals from about 0.1 MHz to about 30 MHz.

The RF amplifier 34 is configured to amplify the incoming RF signals from the console 38 and to transmit the amplified signals to the preamplifier and T/R interface 32. Here, the RF amplifier 34 is a 2 kW pulsed RF amplifier operative from 0.1 to 30 MHz, model BTO 2000-DL, manufactured by Tomco Electronics of Unley, Australia. A ground line 50 of a transmit line 52 is connected to the shield of the room 12 where the line 52 enters the room 12.

Referring again to the console 38, the console 38 is also configured to receive signals from the preamplifier and T/R interface 32 indicative of signals detected from the subject 46, to digitize the received signals, and to transmit the digitized signals to the control/display 38.

Figure 4:
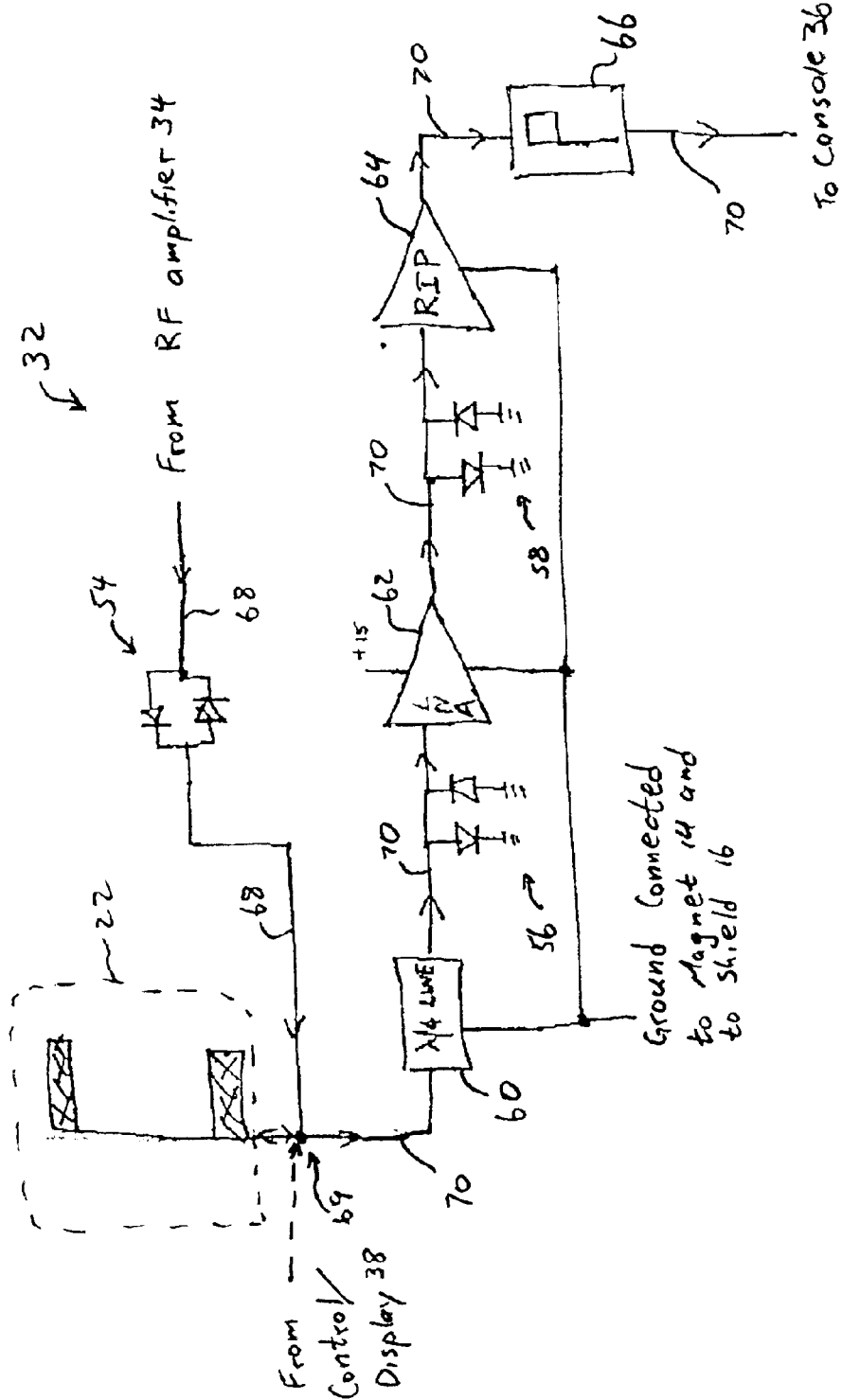
FIG. 4 is a circuit diagram of an RF coil and a preamplifier and transmit/receive interface of the system of FIG. 1.

Referring to FIG. 4, the preamplifier and T/R interface (PTI) 32 includes three pairs 54, 56, 58 of crossed diodes, a quarter-wavelength ( /4) line 60, a low-noise amplifier (LNA) 62, a resonant instruments preamplifier (RIP) 64, and a low-pass filter (LPF) 66. The diodes shown in FIG. 4 and referred to below are representative of electrical characteristics, and may be physically implemented with more than the two diodes shown in each pair. Arrows on the lines in FIG. 4 represent the directions of signal flow in the respective lines. The PTI 32 includes transmit circuitry and receive circuitry. The receive circuitry includes the diode pairs 56, 58, the quarter-wavelength line 60, the LNA 62, the RIP 64, the LPF 66, and connecting lines as shown, including a receive line 70. The transmit circuitry includes the diode pair 54 and a transmit line 68, coupling the RF amplifier 34 (FIG. 1) and the RF coil 22.

In the transmit circuitry, the diode pair 54 is a series-crossed pair of diodes configured to help reduce noise on the transmit line 68. This pair of diodes is implemented with four sets of crossed diodes in series with each other, with each set containing six diodes. These diodes can be 1N448 switching diodes that clip at 0.6V and are made by American Power Devices. Using more than one set of diodes connected in series helps to increase the cutoff voltage. Using multiple diodes per set helps to increase the current-carrying capacity of the PTI 32. RF signals from the RF amplifier 34 are conveyed over the transmit line 68 to the RF coil 22.

A switch 69 joins both the transmit circuitry and the receive circuitry to the RF coil 22. In response to signals from the control/display 38, the switch 69 can selectively transmit signals from the transmit circuitry to the RF coil 22 (transmit mode) or from the RF coil 22 to the receive circuitry (receive mode).

In the receive circuitry, the line 60 is configured to help prevent transmit noise leaking over into the receive circuitry. The line can be configured for about 175.6 KHz for use with Xenon hyperpolarized gas, or about 486.48 KHz for use with Helium hyperpolarized gas. The line 60 is grounded to the magnet 14 (FIG. 1) and the shield 16 (FIG. 1) at the same point that the LNA 62 is grounded to the magnet 14 and the shield 16 as described below.

The diode pair 56 couples the section of the receive line 70 between the output of the /4 line 60 and the input of the LNA 62 to ground. This diode pair 56 includes four sets of diodes coupled in parallel between the line 70 and ground. The pair 56 helps protect the LNA 62 and also helps to reduce noise in the receive circuitry. These diodes can be 1N448 switching diodes that clip at 0.6V.

The LNA 62 provides high gain with a low noise figure as a first stage of amplification of signals received from the RF coil 22 on the receive line 70. Here, the LNA 62 is model AU 1442 made by Miteq Inc. of Hauppauge, N.Y., and has a gain of 37 dB and a noise figure of 0.92 dB. The LNA 62 is grounded to the magnet 14 (FIG. 1) and the shield 16 (FIG. 1). The LNA 62 is directly connected to the shield 16, while a connecting line couples the magnet to the LNA 62 at the same point that the LNA is connected to the shield 16.

The crossed diode pair 58 couples the section of the receive line 70 between the output of the LNA 62 and the input of the RIP 64 to ground. This diode pair 58 includes four sets of diodes coupled in parallel between the line 70 and ground. The pair 58 helps protect the RIP 64 and also helps to reduce noise in the receive circuitry. These diodes can be 1N448 switching diodes that clip at 0.6V.

The RIP 64 provides a second stage of preamplification of signals received from the RF coil 22 on the receive line 70. Here, the RIP is a variable-gain preamplifier with a typical gain of about 40 dB and a noise figure of about 1.5 dB. The RIP 64 is grounded to the magnet 14 (FIG. 1) and the shield 16 (FIG. 1) at the same point that the LNA is grounded to the magnet 14 and the shield 16. An output of the RIP 64 is coupled to an input of the LPF 66.

The LPF 66 is configured to receive signals from the output of the RIP 64, and to inhibit high-frequency components from being transmitted to the console 36 to which the output of the RIP 66 is connected. Here, the LPF 66 is a sixth-order Bessel filter with a cutoff frequency of about 1 MHz.

The system 10 is assembled by connecting the components described above in the arrangement described above. The subject 46 is positioned in the RF coil 22 as shown in FIG. 1. The inhalation mask 44 is placed over the subject's mouth and/or nose. $^{129}$Xe or $^{3}$He gas is hyperpolarized, either in the container 42 or external to the container 42, and stored in the container 42.

Figure 5:
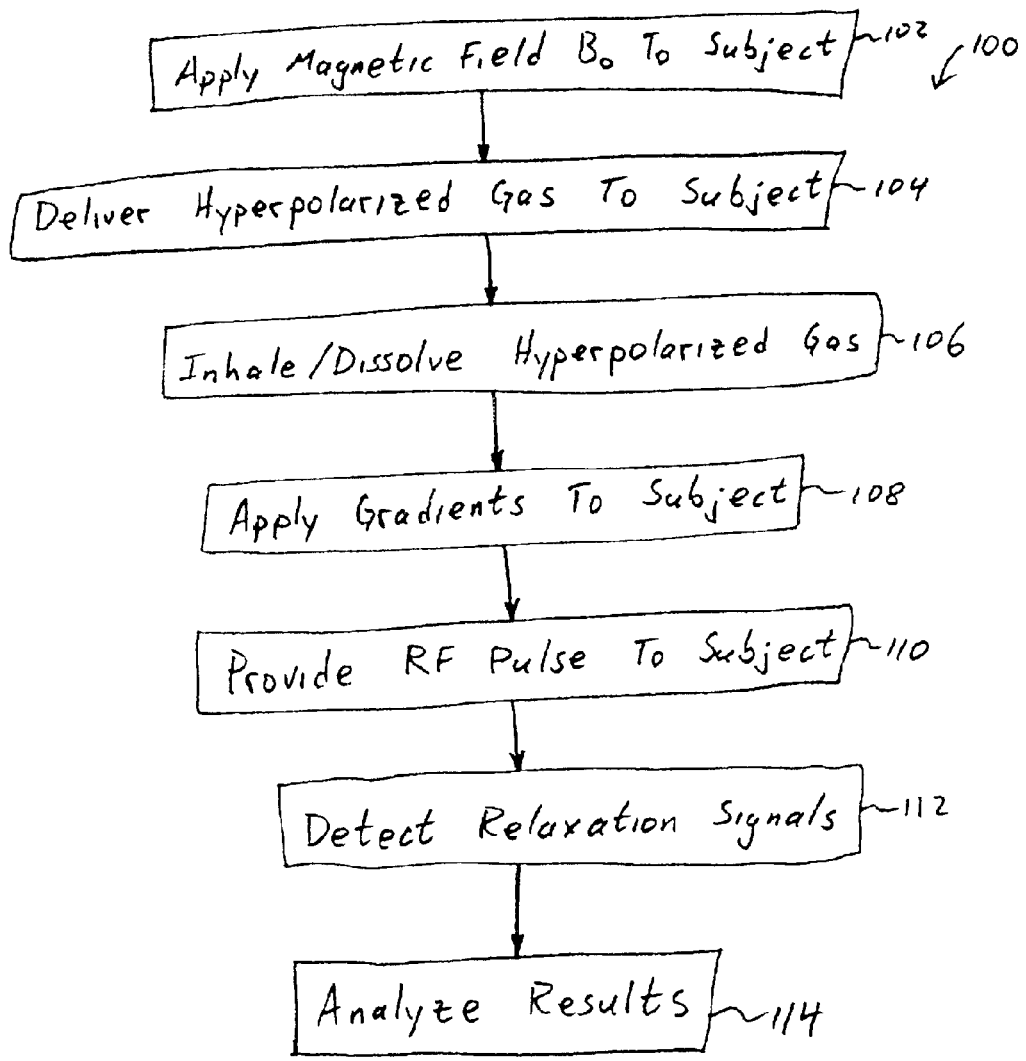
FIG. 5 is a block diagram of an MRI process according to the invention.

In operation, with reference to FIGS. 1 and 5, a process 100 for performing MR scanning provides both imaging and spectroscopy abilities. Whether imaging or spectroscopy is desired can be selected by an operator using the control/display 38. Both imaging and spectroscopy can be used in numerous applications to obtain a wide variety of information. Some applications, including for imaging pulmonary vasculature and arteries, analyzing blood flow, and non-biomedical applications such as rock porosity, are described below. In the discussion below, the subject 46 is assumed to be a living, breathing organism.

At stage 102, a magnetic field is applied to the subject 46. The magnetic field is applied with a field strength of between approximately 0.021 T and approximately 0.1 T. In this example, a field strength of about 0.015 T is applied to the subject 46.

At stage 104, hyperpolarized gas is delivered to the subject 46. Control signals are sent from the control/display 38 to the gas regulator 40. The regulator 40 responds to the control signals by conveying gas from the hyperpolarized gas container 42 to the inhalation mask 44. The subject 46 breathes the gas into the subject's lungs and then holds the gas there (i.e., a breath-hold). For example, for vasculature imaging, about 0.5 to about 1.25 liters of hyperpolarized gas ($^{129}$Xe) is delivered to the subject 46 for a breath-hold time of about 5–15 seconds. Longer breath-hold times can increase adissolved-phase polarized gas perfusion signal.

At stage 106, some of the hyperpolarized gas taken into the subject's lungs is dissolved into the subject's blood. The Xenon or Helium that is in the gas phase has a different Larmour frequency from the Xenon or Helium in the dissolved phase. This helps with selectively exciting and image desired portions of the subject 46 while not exciting or imaging other portions of the subject 46. The subject's blood carries the dissolved gas through the subject 46. For example, the blood can carry dissolved gas into the pulmonary vasculature and to the brain.

At stage 108, appropriate gradients are applied to the subject 46, and in particular to the gas in the subject 46. These gradients can be localized in both frequency and space. Frequency localization helps selectively image either the gas phase nuclei or the dissolved phase nuclei of the hyperpolarized gas. Thus, for example, the gas phase nuclei can be selected for use in analyzing emphysema, air trapping, or diffusion. The dissolved phase nuclei can be selected for use, e.g., in blood flow analysis. Localizing the gradients in space helps to isolate areas of interest in the subject 46. For example, the region around the heart can be isolated for spectroscopic analysis of pulmonary blood flow. Spatial localization also helps to produce images. For example, 128 different gradients can be applied to 128 different, either adjoining or non-adjoining, regions of the subject 46. These regions can be mapped to pixels of a display or printer, etc. for producing an image representing the area containing the 128 regions. Different resolutions are possible, such as 64 or 256 regions.

At stage 110, the RF coil 22 provides excitation pulses to the area of interest of the subject 46. The first pulse is an FID navigator as described above, with following pulses being applied concurrently with gradients. The pulses are in response to signals from the PTI 32, resulting from control signals from the control/display 38. The control/display 38 indicates to the console 36 to produce the RF signals. The console 38 produces RF signals and provides these signals to the RF amplifier 34, that amplifies the signals and provides the amplified RF signals to the PTI 32. The PTI 32 conveys the amplified signals to the RF coil 22, which produces the pulses in response to the amplified signals.

The frequency and duration of the RF excitation pulses can be selected to affect only desired hyperpolarized gas nuclei (e.g., only dissolved phase nuclei). Dissolved phase nuclei exhibit different characteristics (e.g., frequency) depending upon whether the dissolved gas is in tissue, fat, or blood. Thus, the dissolved phase gas can be selected, e.g., excited or destroyed (similar to gas phase nuclei), depending upon the material in which it is dissolved.

The RF pulses can be at a variety of flip angles according to desired results. If an image of an area of the subject 46 using 128 pixels is desired, then the flip angle can be on the order of 5°, such that approximately 60% of the magnetization of the hyperpolarized gas remains after 128 pulses. Alternatively, for spectroscopy, a flip angle of 90° can be used. This will deplete the nonrecoverable magnetization of the hyperpolarized gas in the selected spatial area, and will yield a strong signal, which can be useful, e.g., for blood-flow analysis as described below. The large flip angle pulses can be repeated periodically for comparison of the signals produced and analysis of the comparison combined with the time between pulses (e.g., as described below with respect to blood flow analysis).

At stage 112, the signals produced by the relaxing nuclei are detected and conveyed to the control/display 38. The RE coil 22 is switched from transmit to receive mode such that FID signals from the relaxing nuclei sensed by the RF coil 22 are conveyed from the RF coil 22, through the PTI 32, to the console 36. The console 36 digitizes the received signals and conveys the digitized signals to the control/display 38.

The FID is used to determine the amount of polarization of the hyperpolarized gas in the subject 46. For multishot processes, the k-space is imaged starting from the center and moving outward. Acquired signals are convolved with a digital bandpass filter of bandwidth 10 KHz centered on the appropriate acquisition frequency. Echoes are arranged using MATLAB made by The MathWorks, Inc. of Natick, Mass. The navigator echo is Fourier transformed and the SNR calculated (for use in diagnosing image data). The k-space obtained from the echoes is Fourier transformed to obtain the image. The k-space data (with the signal typically focused toward the center) is filtered with a two-dimensional low-pass filter to increase the SNR. The signals can be encoded for high-spatial frequencies if desired (e.g., for high-definition imaging of narrow airways).

The control/display 38 displays indicia of the received digitized signals, such as by mapping different frequency portions to different pixels to produce an image, or by providing an indication of a composite strength of signals received (e.g., for spectroscopy). The control/display 38 can map the signals to pixels by separating signals according to frequency and displaying on individual pixels an indication of the strength of the signal for each particular frequency. The indication can be, e.g., different intensities and/or colors.

At stage 114, the displayed results on the control/display 38 are analyzed. Spectroscopic analysis can include comparing multiple spectroscopic results over time to determine blood flow. Image analysis can be performed for a wide variety of uses of MRI, examples of which are described below.

Pulmonary Vasculature Analysis

For use in pulmonary vasculature analysis, shortly after inhalation of a suitable amount of hyperpolarized $^{129}$Xe gas (or gas mixture), the system 10 delivers a large flip angle (e.g., greater than about 30°) RF excitation pulse to a selected portion of the pulmonary vasculature of the subject 46. The excitation pulse can have a flip angle much higher than 30°, e.g., 90°. A 30 degree flip angle will generally yield about 50% as much signal as a 90 degree flip (45 degrees typically giving about 70% as much signal).

The RF excitation is selectively performed. That is, "selective excitation" is generated such that it excites only certain frequencies, e.g., only the dissolved phase polarized gas (e.g., any or all of the at least three different dissolved phase frequencies). While the signal strength per voxel is lower in the dissolved phase than in the gas phase, this lower signal strength does not prevent clinically useful perfusion imaging. An exemplary delivery of a selective excitation pulse is via a "hard" pulse. As used herein, "hard" pulse includes pulses where the RF is turned on for a short pulse time ("$t_{pulse}$") and then shortly thereafter, e.g., substantially "instantly", turned off. However, short pulse times can yield large frequencies or uncertainty in the associated frequency it generates. Therefore, selective excitation can be performed such that the pulse frequency is centered on the dissolved gas phase resonance desired (i.e., 17.59648 MHz) and has a pulse time, $t_{pulse}$ such that the associated frequency is below the corresponding gas phase excitation frequency (i.e., 17.6 MHz). For example, one frequency spectrum of a square excitation pulse having a time $t_{pulse}$ and that is centered on a frequency ("fo") can be described by the equation:

$$\sin(a(f-fo)/a(f-fo)), \text{ where } a=3.1416*t_{pulse}.$$

Therefore, the pulse time $t_{pulse}$ is preferably set so that the sin (a(f−fo))=0 for the gas phase component. Stated differently, the pulse time $t_{pulse}$ is determined according to the relationship $t_{pulse}=1/(f-fo)$. For a 1.5 T magnetic field strength, f−fo equals 3.52 KHz and $t_{pulse}$ is about 284 $\mu$-seconds ($10^{-6}$). Alternative approaches can also be used, such as but not limited to, sine pulses, Gaussian pulses, and the like.

The selective excitation is timed such that it excites the entire pulmonary blood volume. The pulmonary blood volume includes the volume of blood which fills the blood passages associated with the circulatory system between and/or within the lungs and the heart (which can include the volume of blood or a portion of the volume of blood within the boundary lung tissue and/or heart). Because of the expected $T_1$ of the dissolved phase polarized $^{129}$Xe in the blood, it is possible that only the venous side of the pulmonary circulatory system will include $^{129}$Xe with sufficient polarization levels to provide detectable signal strength). Unlike imaging the gas-phase $^{129}$Xe in the lung where conventionally small flip angles are used to avoid destroying the available magnetization, there is minimal and most likely no penalty for using a large flip angle excitation of the dissolved phase $^{129}$Xe in the pulmonary vasculature because the magnetization will otherwise flow out of the chest region unimaged. Further, "fresh" magnetization is substantially continuously flowing in from the capillary beds.

Blood flow throughout the pulmonary and cardiac vasculature and/or blood flow in particular localized regions of the pulmonary and cardiac vasculature can be evaluated. The term "pulmonary and cardiac vasculature" as used herein includes all of the blood vessels within the lungs and/or heart, the chambers of the heart, the passages between the chambers of the heart, as well as the blood vessels between the lungs and heart, and blood vessels between the lungs or heart and other tissues and/or organs. The pulmonary and cardiac vasculature includes, but is not limited to, the pulmonary veins and arteries and associated capillaries, the left and right atria of the heart, the left and right ventricles of the heart, the myocardium, the aorta and aortic arch, the coronary artery, the coronary arteries, the subelavian arteries, and the carotid arteries.

Clinically useful images may be produced in low fields (e.g., about 0.0001 T to about 0.1 T) of the left and right pulmonary veins and associated capillaries, the left atrium and left ventricle, the myocardium, the ascending aorta, the coronary arteries, the aortic arch, the descending aorta, the left and right subelavian arteries, and the left and right carotid arteries.

The delay $T_R$ between large angle (e.g., 90°) RF excitation pulses is preferably less than the time $t_p$ for $^{129}$Xe to be transported out of the pulmonary region or chest area. It may be advantageous to further shorten this delay time. For $T_R$ less than or equal to the time $t_p$, signal strength in the (perfusion) image will be substantially linearly proportional to the inhaled gas volume and the $^{129}$Xe polarization level of the inhaled gas. Multi-echo pulse acquisition can be used to increase the sensed signal strength and SNR. The number of echoes preferably used varies depending upon $T_1$, $T_2$, $T_2^*$, and the imaging time. The echoes preferably used are the echoes until the next echo will decrease the SNR.

Multi-slice imaging may be employed, with slice acquisition being performed by interleaving the slices. A slice-selective acquisition will only excite spins in a given slice of the lung. Once a slice has been excited that slice is not excited again until the time $T_R$ has elapsed and spins in the hyperpolarized dissolved gas have flowed back into the slice. However, alternate slices can be excited and imaged during this "waiting" period. The same holds true for gas phase imaging. Such interleaving of slices allows image acquisition time to be reduced. One concern for multi-echo imaging methods is the flow of blood and the affect on the ability to (re)focus the echoes. Thus, multi-echo imaging methods may be facilitated by the use of cardiac-gated imaging.

Imaging with polarized dissolved gas depends on transport of sufficient surviving polarization or magnetization to tissues of interest. In a preferred embodiment, the tissues of interest include the pulmonary region, and particularly the pulmonary vasculature. Polarization decays correspond to the longitudinal relaxation time, $T_1$. Dissolved phase $^{129}$Xe can have a relatively short relaxation time ($T_1$) possibly due to the binding of dissolved molecular oxygen to paramagnetic deoxyhemoglobin, or to deoxyhemoglobin, in the blood. Albert et al., "$T_1$ of $^{129}$Xe in Blood and the Rate of Oxygenation," J. Magna. Reson., 140; 264–273. For example, TI for substantially fully oxygenated human blood has been measured to be about 10 seconds. Taking the estimated upper limit of about a five second transit time to the heart as discussed above, the Xenon polarization can be attenuated to about ⅓ of its starting value at the heart. This relationship supports that $T_R$ can be shortened to less than about 2.5 seconds, e.g., less than about 1–2 seconds. Correspondingly, with about a 2.5 second transit time, the magnetization can be calculated as noted above to be about 0.61 of its starting magnetization.

Dissolved-phase imaging can be used to detect a pulmonary embolus. Emboli tend to occur in the arterial side of the pulmonary vasculature, while the $^{129}$Xe uptake tends to occur on the venous side of the pulmonary vasculature. However, it is believed that symmetry in the venous-arterial branching will allow arterial defects to appear on the venous side. For example, for a patient with a blood clot or obstruction in the left pulmonary artery which occludes substantially all blood flow, then the $^{129}$Xe dissolved phase image will show minimal or no left lung vasculature in the image because there is no flow to carry the polarized Xenon from the capillary beds forward. Similarly, if the obstruction or clot is in the first branch of the left pulmonary artery, the corresponding dissolved phase ("perfusion") image will not show a portion of the venous vasculature before the first branching on the venous side. Further, when imaging to detect emboli, sufficient resolution techniques should be employed to help assure that any embolus in a given arterial vessel is detected. Thus, image resolution should be such that it corresponds to typical embolism size, vasculature location and vasculature structure (venous branching).

Due to the approximately 200 p.p.m. chemical shift between the gas and dissolved phase resonance of the hyperpolarized $^{129}$Xe, at least two images including both a perfusion and a ventilation image can be generated on a patient during the same imaging session ("differential" imaging). Differential images provide additional image information. For example, the differential image can help distinguish between a pulmonary embolus and a matched ventilation/perfusion defect associated with a structural anomaly. The inhalation image can be produced using hyperpolarized $^3$He while the perfusion image can be produced using hyperpolarized $^{129}$Xe. The images are generated from two data sets captured on two separate imaging sequences. For images using $^{129}$Xe as both the inhalation and perfusion medium, the same breath-hold delivery cycle can be employed for both sets of image data. In such an embodiment, the perfusion image is generated during the first 10 seconds of a 15-second breath-hold cycle and the remaining gas in the lung is used for a ventilation image. Separate breath-hold delivery cycles can also be used. Differential imaging will allow better images with information that correlates the total region (lung space and boundary regions). This should also produce images that detect emboli, perfusion defects, and other circulatory system problems in the pulmonary and/or cardiac vasculature.

Cardiac Imaging Method

Similar to pulmonary vasculature imaging described above, embodiments of the invention can be used for cardiac imaging using dissolved hyperpolarized $^{129}$Xe to image the heart and cardiac blood vessels (in particular, major cardiac blood vessels). As described above, after inhalation, the dissolved phase $^{129}$Xe is transported in the blood flow path of the pulmonary vasculature to the heart. Subsequent to inhalation, at least a portion of the polarized gas enters into a dissolved state that enters the pulmonary vasculature, including the boundary tissue, cells, membranes, and pulmonary blood vessels such as capillaries, venules, veins, and the like. More specifically, a substantial amount of the dissolved polarized $^{129}$Xe ultimately enters the blood stream with an associated perfusion rate and cycles to the heart via the left atrium, then to the left ventricle and out of the heart. There is limited or no vascular branching in the blood flow path of the heart until after the left ventricle. As such, imaging the left side of the heart (atrium and ventricle) can be performed with the dissolved phase polarized $^{129}$Xe in the associated blood flow path similar to techniques described above for imaging the pulmonary vasculature. Like the pulmonary imaging method, large angle excitation pulses can be produced in an MRI system and those pulses can be timed in accordance with the blood replenishment rate to the region of interest.

The inhaled polarized $^{129}$Xe in the lung gas space acts as a substantially continuous supply of polarized $^{129}$Xe for dissolution and entry into the pulmonary blood. Preferably, the large angle pulse "selectively" excites only the blood-dissolved $^{129}$Xe, leaving the lung with a sufficient quantity of polarized gas at a sufficient magnetization level for a substantially continuous supply of gas. The gas migrates to and enters a dissolved phase in the pulmonary vasculature, and ultimately the associated blood stream for the imaging. As before, the timing of the RF pulses are dependent on the volume of the region to be imaged ("V") and the blood flow rate (Q). The volume of the left ventricle (V) varies between about 140 ml and 60 ml depending on the phase of the cardiac cycle. The blood flow rate (Q) is estimated at about 80 cc/s, while $t_p$ for the left ventricle is estimated to be above 0.5 and below 2 seconds. More particularly, using the above stated parameters, $t_p$ is estimated as between about 0.8 seconds and about 1.8 seconds. The RF pulse repetition interval $T_R$ is set such that it is less than or equal to the corresponding blood flow time $t_p$. Any initial pulse should be timed to allow the dissolved $^{129}$Xe to be transported to the heart (e.g., 2.5–3.5 seconds after inhalation). Subsequent pulses are preferably timed to obtain signals from the dissolved polarized gas while reducing the destruction of incoming magnetization. Thus, additional excitation pulses can be used without waiting for the entire vasculature to be refilled with unaffected dissolved polarized gas.

Figure 6:
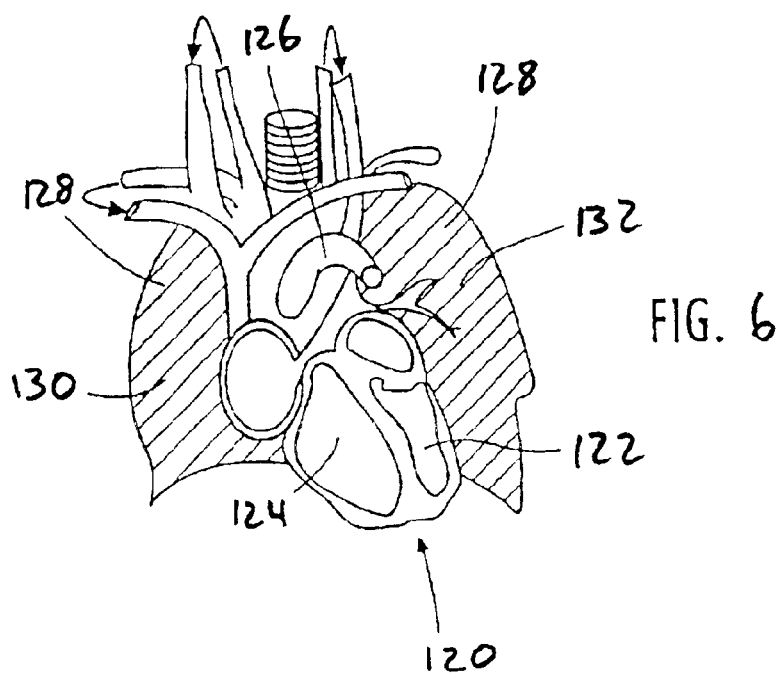
FIG. 6 is a schematic diagram of human pulmonary blood vasculature.
Figure 7:
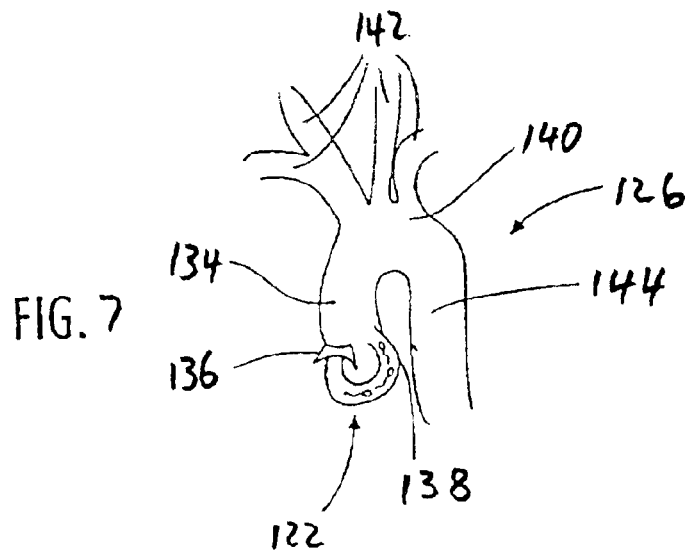
FIG. 7 is a schematic diagram of the aorta shown in FIG. 6.

Embodiments of the invention can also be used to image the heart beyond the left ventricle. As shown in FIG. 6, the heart 120 includes left and right ventricles 122, 124 and the aorta 126. As also shown, lungs 128 include right and left lungs 130,132. Referring also to FIG. 7 blood flows from the left ventricle 122 up the ascending aorta 134 where the first branching is to the coronary arteries 136,138. Perfusion imaging (e.g., dissolved phase polarized $^{129}$Xe imaging) of these coronary arteries 136,138 can provide valuable information about the condition and status of these arteries, such as blockage, thickening, and the like. Continuing along the blood flow path after the coronary arteries 136,138, is the aortic arch 140, a quadruple branching 142 at the top of the arch (to the right and left carotid arteries and the right and left subclavian arteries) and then the descending aorta 144. As the dissolved $^{129}$Xe flows along this blood flow path, the signal is sufficiently strong to render clinically useful images. Clinically useful images of target regions can include, but are not limited to, the left and right pulmonary veins and associated capillaries, the left atrium and left ventricle, the myocardium, the ascending aorta, the coronary arteries, the aortic arch, the descending aorta, the left and right subclavian arteries, and the left and right carotid arteries. Using polarized gas with increased polarization levels (i.e. above 20%) can further expand the dissolved phase imaging regions.

Further, it is anticipated that perfusion images can be used in regions or organs which absorb or pass blood such as, the brain and the liver, and images of the kidney have been demonstrated. In performing such imaging, it should be recognized that some of the polarized dissolved-phase $^{129}$Xe will be retained in the respective tissues at different chemical shifts. However, as described above, volume calculations of the region or area of interest can be used to determine the pulse repetition rate to increase the use of the dissolved polarization-related signal.

A small close-fitting cardiac surface coil can be used to deliver the excitation pulse rather than a conventional body coil. This will allow improved SNR and spatially limit the RF pulse to this smaller region, thereby reducing the incidental destruction of the $^{129}$Xe incoming from the pulmonary vasculature. A description of surface coils can be found in "Superconducting MR Surface Coils for Human Imaging," Ma et al., Proc. Intl. Soc. Mag. Reson. Med. 7, p. 171 (1999).

Spatial localization can also be achieved with spatially-selective gradients and pulses. Gradients can alter the Larnour frequency of nuclei in selected areas of the subject 46 such that when RF pulses excite these nuclei, the relaxation signals produced are from the selected area only.

Volume-selective imaging allow a two-dimensional spatial localization using a single pulse. RF pulse/gradient combinations can excite a filled volume, e.g., cylinder, of spins. This may be particularly suitable for cardiac perfusion images that allow coronary artery images while also reducing background signal from the left side of the heart.

A pulse-gradient combination can also limit the collateral damage to the incoming magnetization, thereby increasing the image SNR. Multiple echo signals can be used (e.g., multiple gradient-recalled or RF-recalled echoes) to increase image SNR with the number of echoes.

An additional alternative to cardiac imaging is to directly deliver polarized gas $^{129}$Xe to a region of the heart (such as via injection and the like into the left ventricle muscle) to image the perfusion of the heart. Delivery directly to the right atrium/ventricle can allow perfusion imaging of the return side of the heart. The polarized $^{129}$Xe delivery can be via injection of various phases/vehicles such as but not limited to gaseous, dissolved, or liquid phase. Conventional image perfusion methods for this area employ radioactive tracers such as Thalium ("$^{201}$Tl") or Technetium ("$^{99M}$Tc"). Using Xenon, which is an inert noble gas, can beneficially replace radioactive tracers which can expose the subject to potentially dangerous elements. Also, biocompatible agents can be used as carriers such as lipid solutions (intralipids), liposomes, perfluorocarbons, and saline. Using these agents may enhance the blood-phase signal.

Blood Flow Analysis.

The lung and heart blood flow can be evaluated by using the dissolved-gas phase of the $^{129}$Xe inhaled gas that enters the vasculature (lung perfusion) and the blood stream as described above. This can be relatively inexpensive and can employ the inhaled hyperpolarized $^{129}$Xe to evaluate blood flow in a low-field NMR spectroscopy system. Blood flow in regions of the subject 46 other than the lung and heart can also be imaged according to embodiments of the invention. For example, embodiments of the invention can be used to image the brain, e.g., for regional cerebral blood flow (RCBF) measurement.

Frequency selective large angle (e.g., 90°) RF excitation pulses are used that substantially deplete the $^{129}$Xe in the pulmonary blood but leave the hyperpolarized gas in the lungs substantially undisturbed. A repetition time interval between RF pulses ($T_R$) is selected such that the hyperpolarized gas in the region being analyzed is not fully replenished. The time $T_R$ and the detected signals for consecutive pulses are compared to determine how much hyperpolarized gas is replenished in the time $T_R$, which is a function of how much blood flows into the region during the time $T_R$. Also, the repetition time interval between RF pulses ($T_R$) and the pulmonary blood flow rate (Q) can be used to determine the effective pulmonary volume ($V_{eff}$) containing (dissolved phase) hyperpolarized $^{129}$Xe.

MR spectroscopy using $^{129}$Xe can be simpler and less expensive relative to the cost of other MR images. For example, the quantity of polarized gas needed, the polarization level of the polarized gas, and the isotopic enrichment can be reduced as compared to those used for conventional polarized gas MR imaging. The spectroscopic perfusion measurement can be made with about 100 cc of unenriched gas polarized to only 1–2%. This is in comparison to a polarization of 20% for 500 cc of 80% isotopically enriched $^{129}$Xe to yield a comparable MR image. Also, spectroscopic methods do not require a polarization calibration because the measurement is "self-calibrating". Stated differently, the polarization is cancelled by comparing dissolved and gaseous Xenon signals both of which can be assumed to have identical polarization to the extent that the $T_1$ relaxation in the blood is negligible, which it is for short $T_R$ settings low magnetic fields, such as 0.001 T–0.01 T. The lower field limit may be governed by the length of the pulse needed to get selective excitation. For example, a 200 ppm shift at 1.5 T means a frequency difference of about 3.52 KHz. For a hard pulse, it is desired to have a pulse length of about 284 μs so that the gas phase remains substantially or totally unexcited. Reducing the field by a factor of ten to 0.15 T gives a frequency difference of 0.352 KHz and the corresponding discriminating pulse length of about 2.84 ms. Similarly, at 0.015 T (15 OG) the pulse length is about 28 ms. Soft pulses can improve frequency selection and allow for longer pulse lengths. Pulse lengths of 28 ms and longer are useful, especially given that $T_2$* can be about 100 ms in the lung and possibly longer in blood. Embodiments of the invention can be used to successfully provide images using low field strengths, e.g., 0.017 T and less.

Shimming can be used to lengthen the effective transverse relaxation time $T_2$*. The shims 16 can be adjusted to achieve desired results, including lengthening the $T_2$*. With a longer $T_2$*, lower fields can be used with selective excitation employing longer pulse lengths than when the $T_2$* is shorter.

Other techniques may be employed for use at lower fields that make the length of $T_2$* irrelevant. DANTE pulse sequences can be used, in particular Jump Return pulse sequences, such that there is no limit on the pulse length that can be used for selective excitation. DANTE pulse sequences are discussed in Callaghan, Paul T., "Principles of Nuclear Magnetic Resonance Microscopy," Oxford, 1991, Ch. 3.2.6. Jump Return sequences are discussed in Pike, M. M. et al., "NA-23-NMR Measurements of Intracellular Sodium in Intact Perfused Ferret Hearts During Ischemia and Reperfusion," Amer. J. of Physiology, v. 259, iss. 6, pp. 1767–1773. Additionally, a continuous wave (CW) technique may be employed to sweep the magnetic field to select the frequency corresponding to the frequency of the RF coil 22. This technique call help to isolate very small differences in frequency, e.g., 35 Hz at 150 G. Alternatively, the RF coil 22 can be tuned in frequency while keeping the magnetic field strength substantially constant.

Other techniques can also be used. For example, spin echo refocusing techniques such as CPMG can be used employing a frequency selective pulse. Also, flow-sensitive pulse sequences can be used.

Relatively poor magnet homogeneity is acceptable because gradients are proportionally very high compared to high-field (e.g., 1.5 T) systems. Not requiring high homogeneity allows much cheaper systems to be used. The reduced expense will be evident both in initial cost and upkeep (e.g., operational and maintenance costs).

Further, a simplified and lower cost polarizer system can be used to polarize 20 the $^{129}$Xe. For example, the low cost polarizer system can use a lower power optical laser (such as a 10 Watt laser with or without line narrowing) and reduced accuracy measurement and associated equipment due to less need for accurate polarization, each of which can provide additional cost savings over that of other systems used for other imaging methods.

The appropriate magnet homogeneity associated with the subject's chest area for spectroscopy imaging can be estimated by the corresponding chemical shift of $^{129}$Xe in the dissolved phase in the blood over that in the gaseous phase. This shift, as discussed above, is about 200 ppm. Thus, in order to achieve "selective" excitation of the dissolved phase, a field homogeneity of about 50 ppm or less, e.g., 20 ppm or less, may be used. In contrast, conventional MRI systems are shimmed to about 1 ppm homnogeneity.

Pulmonary emboli or other blockage can also be detected by measuring the pulmonary blood flow rate (Q). This measurement is based on normal blood flow rates in healthy subjects. Blockage detection can also consider heart rate, e.g., by correlating the blood flow rate (Q) with heart rate ("R"), e.g., with a normalized flow rate Q/R.

Unique real-time information about blood flow and perfusion can be determined that is difficult to achieve by other means. The dissolved phase $^{129}$Xe can be (selectively) excited with a large flip angle excitation pulse as described above. The pulse sequence can be correlated with the blood volume (or flow rate) to increase the signal with the magnetization in the blood.

Blockage in the blood flow path of the subject can be based on the results of measured blood flow. The blood flow rates of healthy subjects are compared to the measured flow rate. In determining if there is a problem, the heart rate is taken into account. Accordingly, the heart rate of the subject is used to normalize the measured blood flow rate.

For repetition times $T_R$ that are less than $t_p$, the signal will be substantially linear with $T_R$. In addition, an integrated signal versus $T_R$ will be proportional to blood flow rate (Q). Thus, a substantially calibrated measurement of the blood flow rate (Q) can be obtained. This can be done relatively inexpensively, simply and accurately with a low field magnet and with low homogeneity requirements.

A spectroscopic signal associated with the dissolved-phase $^{129}$Xe can be derived such that it represents a blood volume or blood flow rate. The subject 46 can be subjected to a drug therapy or surgery to treat a cardiac or pulmonary vasculature or blood flow problem. A second signal can be obtained and a comparative, relative, or percent increase (or decrease) in blood flow can be obtained without requiring an "absolute value" of blood volume. Such a comparative MR spectroscopy evaluation can be done in real-time to indicate during surgery (such as during angioplasty) whether a blood flow path obstruction has been removed or diminished. Further, such a comparative measurement or evaluation can be used to determine whether drug therapy improved a subject's blood flow (by allowing an increased blood volume or rate (such as due to a less viscous blood or lipid management) and the like.

Additionally, due to the depolarizing effect of oxygen depleted blood on dissolved phase polarized $^{129}$Xe, MR spectroscopy signal intensity (reduced or increased) can be used to evaluate conditions associated with reduced or increased levels of oxygen along the Xenon-blood barrier or blood flow path. The deoxyhemoglobin is paramagnetic and has a greater depolarizing effect on the dissolved phase $^{129}$Xe. The well oxygenated blood or tissue provide longer T1's compared to oxygen starved blood or tissue. Thus, a stronger spectroscopy signal relates to well oxygenated levels of oxygen in the tissue or blood while a weaker or lower spectroscopic polarization-based signal relates to oxygen-starved, depleted or deprived regions.

A quantitative assessment of blood flow (e.g., perfusion) can be made, e.g., by integrating signal intensity over time. Using noble gases allows such assessment while resulting in essentially no "residue" of polarized gas in the blood after about 1–2 minutes.

Experimental Results

Figure 9:
FIG. 9 is an MRI image of live rat lungs using the system of FIG. 1 with hyperpolarized $^3$He and a magnetic field of 150 G.
Figure 10:
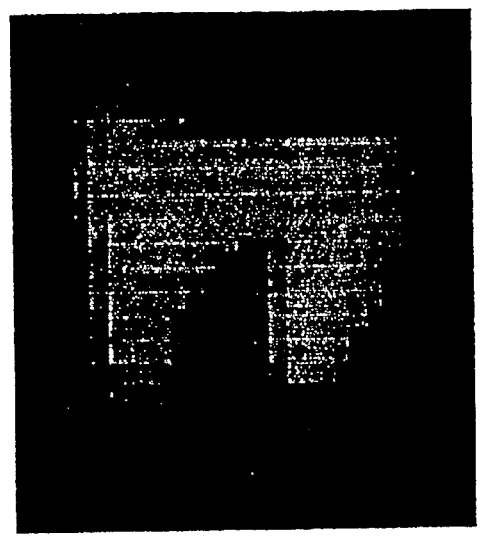
FIG. 10 is an MRI image of a coronal view of live rat lungs using the system of FIG. 1 with hyperpolarized $^{129}$Xe and a magnetic field of 150 G.
Figure 11:
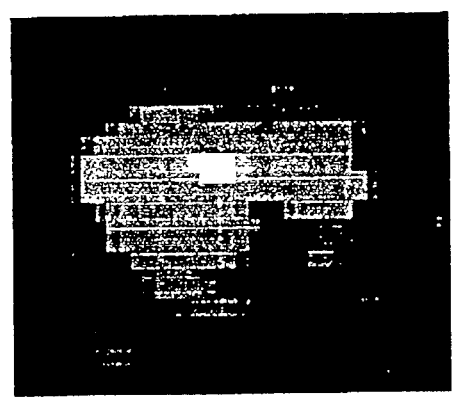
FIG. 11 is an MRI image of an axial view of live rat lungs using the system of FIG. 1 with hyperpolarized $^{129}$Xe and a magnetic field of 150 G.
Figure 12:
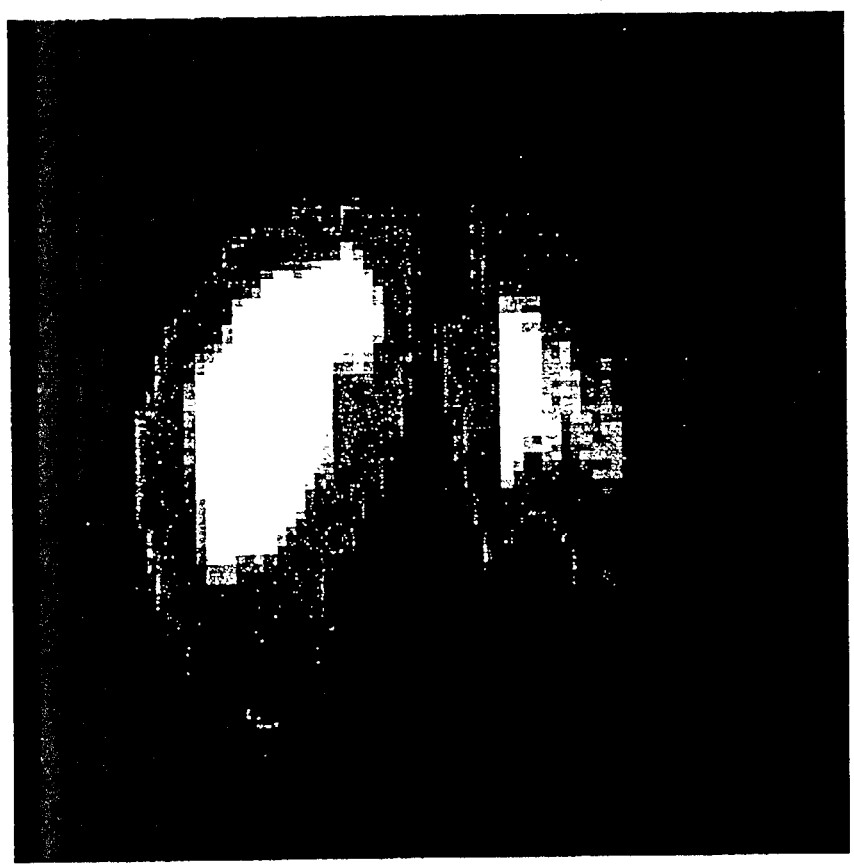
FIG. 12 is an MRI image of live human lungs using the system of FIG. 1 with hyperpolarized $^{3}$He and a magnetic field of 150 G.

Experiments were conducted on a live rat and a live human using the system 10 built according to the descriptions above. A superconducting magnet was used as the magnet 14, with its magnetic field $B_0$ set to 150 G. A live rat was given hyperpolarized $^3$He and hyperpolarized $^{129}$Xe and its lungs were imaged in vivo according to the descriptions above. Referring to FIGS. 9–11, it can be seen that useful images were obtained for in vivo rat lungs at 150 G. A human was also given hyperpolarized $^3$He in a Tedlar Bag and its lungs were imaged in vivo according to the descriptions above. Referring to FIG. 12, it is seen that useful images were also obtained for in vivo imaging of the human lungs at 150 G using hyperpolarized $^3$He. Specifically configuring the system 10 for low fields, e.g., using a magnet specifically designed for magnetic fields about 0.0001 T–0.1 T, and designing shielding specifically for the fields to be used, should yield even better images.

Other Embodiments and Applications

Figure 16:
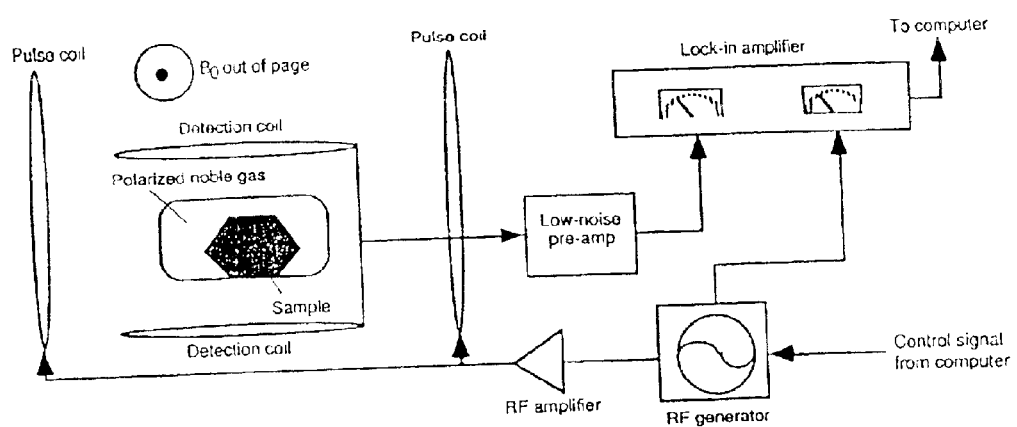
FIG. 16 is a schematic diagram of a portion of a low-field MRI system employing separate, crossed coils for transmission and receipt of RF signals.

Other embodiments are within the scope and spirit of the appended claims. For example, phase encoding can be performed. It is currently believed that any method of traversing k-space may be used. Also, while the system 10 shown uses a single RF coil 22 for both transmit and receive, separate, crossed coils can be used, one for transmit and one for receive, e.g., as shown in FIG. 16. The shims 16 can be electromagnets as described, or, alternatively, ferromagnetic elements or permanent magnets. The RF coil 22 can be imbedded in a vest that can be worn by the subject 46 and can include the gradient coils 18. The RF coil 22 could also be mounted to a wall of the room 12. The low-pass filters 26 can be replaced with one or more bandpass filters to help reduce frequencies below, as well as above, the imaging frequencies. The Helmholtz RF coil 22 described can be replaced with a single surface coil. Also, images can be obtained by changing the applied magnetic field $B_0$ and using gradients and detecting signals adiabatically without applying RF pulses.

The gas regulator 40 can take a variety of different forms. For example, it can be a relatively complex gas delivery system or a very simple structure such as a bag or pressurized vessel containing the hyperpolarized gas. The subject could sip the gas, e.g., from a straw, so that the inhalation mask 44 can be eliminated.

The control/display 38 can be configured to perform other types of imaging than described above. For example, the imaging can be performed without centric encoding. Also, echo summation techniques can be used. These techniques include multi-gradient echo imaging and spin echo techniques. The spin echo techniques can be performed with or without centric encoding. Also, non-Fourier techniques are acceptable for imaging hyperpolarized gas, such as adaptive imaging including zooming in to image a portion of a previous image of particular interest. CTMG spin echo sequencing can be used to refocus spins to get longer relaxation times and measure the relaxation signal longer than with other techniques. The control/display need not provide a navigator.

A smoothly-shaped gradient pulse is not required. For example, a square wave pulse can be used, and filters configured and arranged to reduce noise at the imaging frequency or frequencies.

Other console frequency ranges may be achieved, e.g., using other console configurations than described above.

Figure 13:
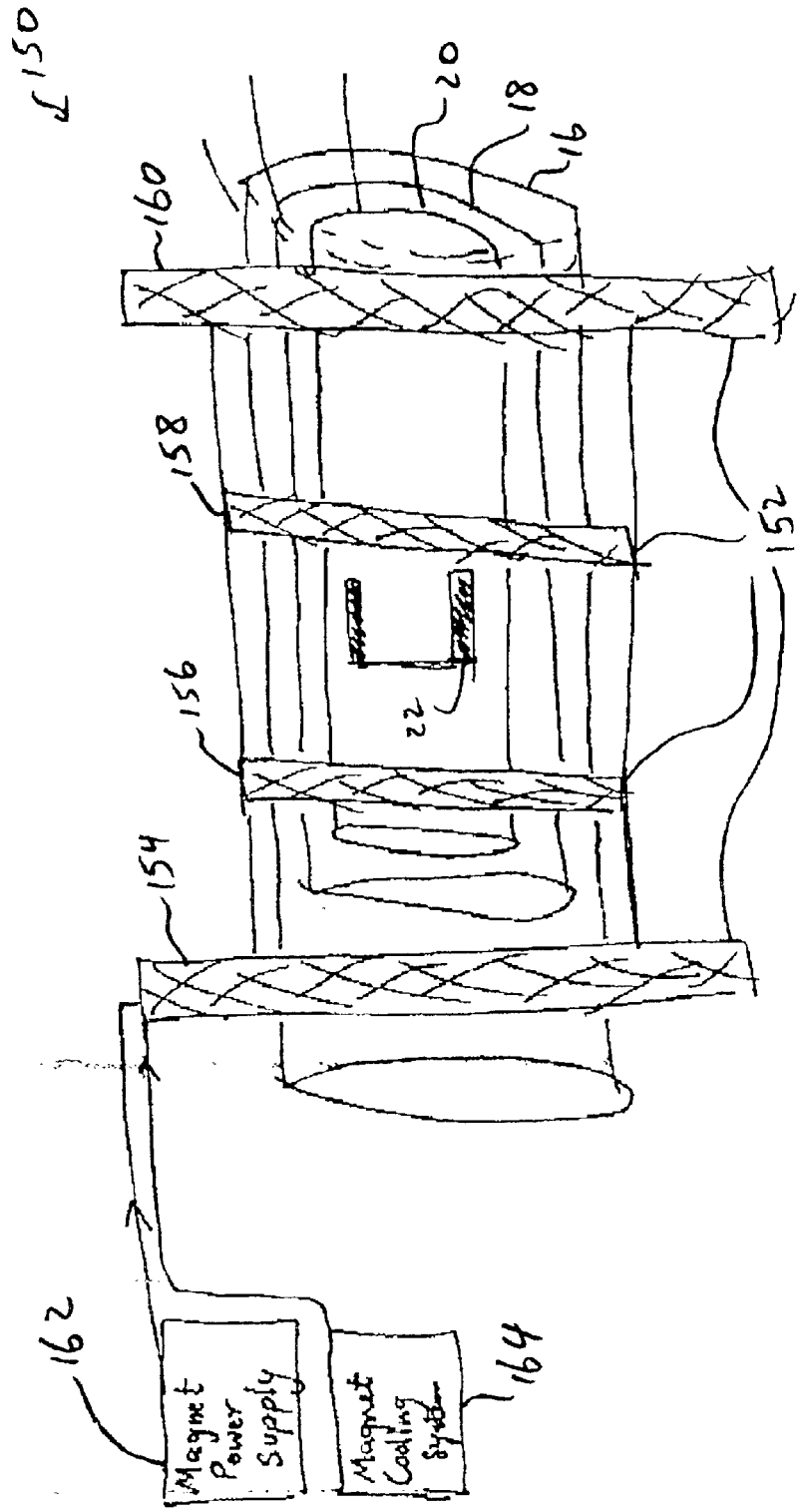
FIG. 13 is a schematic diagram of a portion of a low-field MRI system employing an electromagnet.

Referring to FIG. 13, a low-field MRI system 150 is similar to the system 10 shown in FIG. 1 with an electromagnet 152 replacing the magnet 14 (FIG. 1) for providing the magnetic field $B_0$. The electromagnet 152 includes four coils 154, 156, 158, 160. The coils 154, 156, 158, 160 are powered by a magnet power supply 162 and are cooled by a magnet cooling system 164. The outer coils 154 and 160 are larger in outer diameter than the inner coils 156, 158. This arrangement can be reversed, with coils 154, 160 being disposed inward of coils 156, 158. This may provide a smaller field of view, but a more homogeneous magnetic field than with the arrangement shown. A solenoid can be used for the RF coil 22 (e.g., the coil described can be used for humans and a solenoid used for animals).

Magnet arrangements with substantially open configurations can provide magnetic fields in the subject 46.

Figure 14:
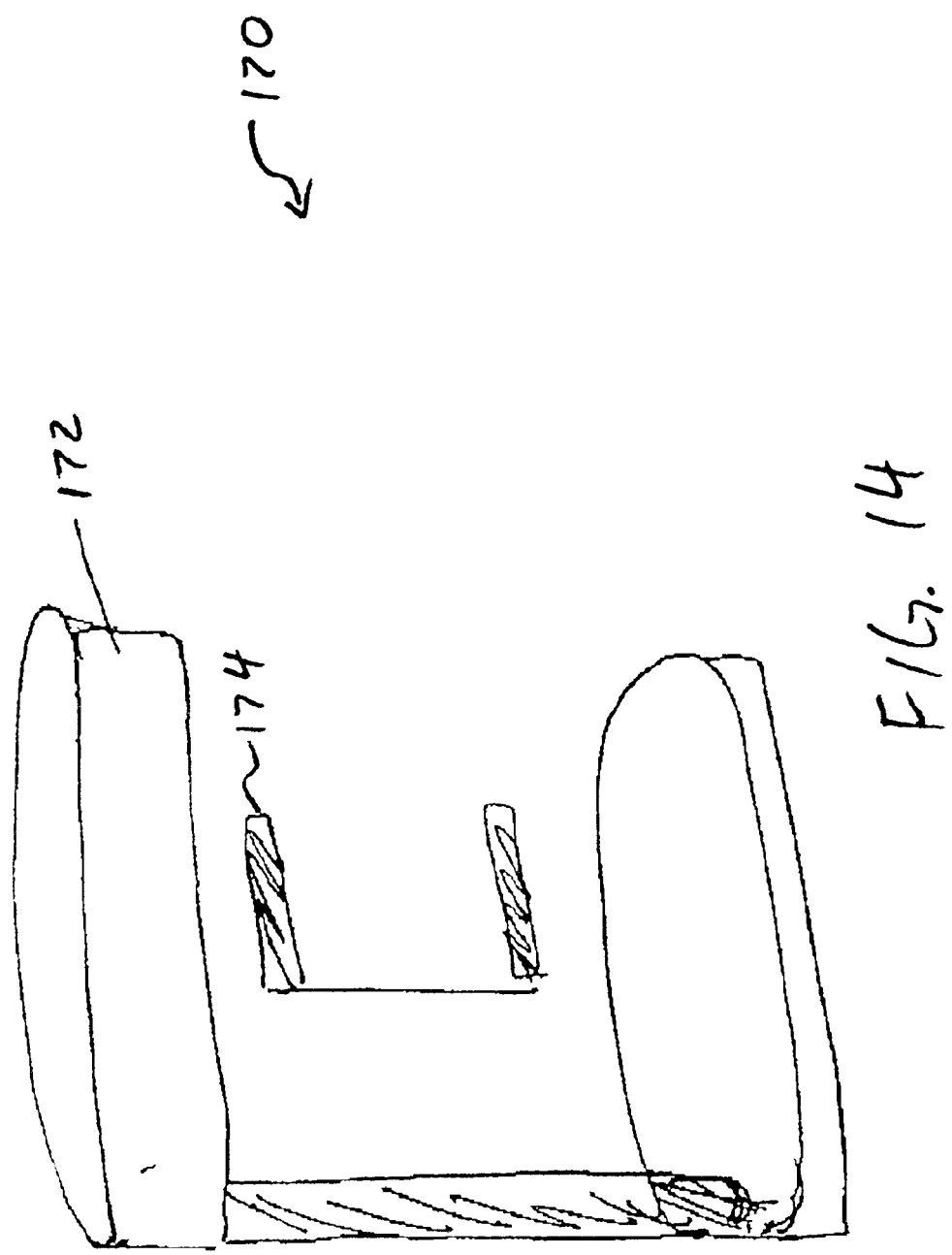
FIG. 14 is a schematic diagram of a portion of a low-field MRI system employing a permanent magnet.

Referring to FIG. 14, a low-field MRI arrangement 170, for use in a low-field MRI system, includes a permanent magnet 172 for providing a magnetic field, and an RF coil 174. The magnet 172 has built-in gradients and shims. The permanent magnet 172 is open, as shown, allowing a subject to be placed in the RF coil 174 easily, without being inserted into a bore of a tube. This arrangement can facilitate MRI, allowing patient's with claustrophobia, or large persons, to be imaged that previously would be reluctant or unable to be imaged. This can also facilitate imaging subjects in a variety of positions other than lying down, such as sitting or standing. The arrangement 170 is lightweight and mobile.

Figure 15:
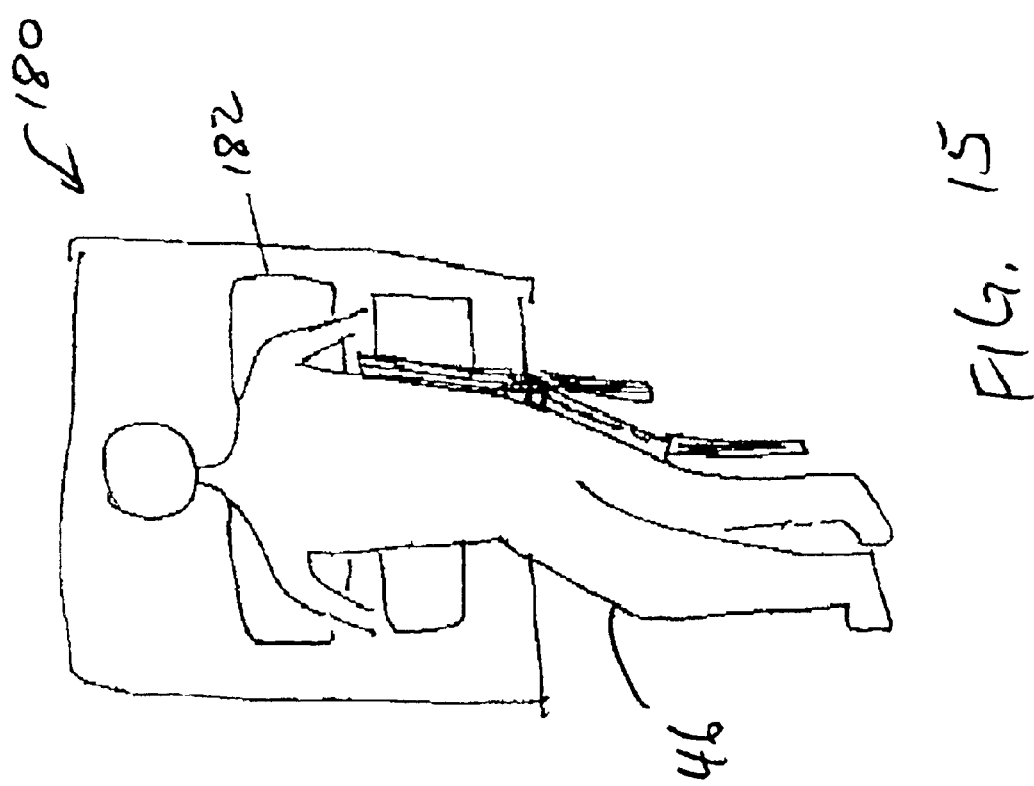
FIG. 15 is a schematic diagram of a portion of a low-field MRI system employing a planar magnet.

Referring to FIG. 15, a low-field MRI arrangement 180, for use as part of a low-field MRI system, includes a planar magnet 182 with a built-in RF coil and built-in gradients. This arrangement 180 is even more open than the arrangement 170 shown in FIG. 14. Using this arrangement 180, subjects can be imaged in a variety of positions instead of the traditional horizontal position. For example, the subject 46 can be imaged while sitting (as shown) or standing. This may help provide images that better show a subject's condition. For example, blood flow in the lung is different if the subject is standing or sitting (or in another position with the subject's torso at least partially upright) versus lying down. Thus, it may be desirable to image the subject 46 while the subject standing, or sitting, etc. Other positions may be desirable for other images and may also be accommodated by the arrangement 180. The planar magnet arrangement 180 can also help with real-time imaging during medical procedures such as surgery. For example, the arrangement 180, or at least the flat magnet 182, can be placed on an operating table, and real-time images provided during surgery on the subject 46 being imaged.

Other applications for embodiments of the invention are also possible. Applications include a wide range of diagnostic applications including evaluating cardiac, pulmonary, or cardiovascular function. Perfusion rates can be determined and the severity of abnormal perfusion identified and/or assessed. Temporal variations in blood flow can be determined, e.g., to assess the effects of a vasocontractory or vasodilatory substance and/or to identify regions of surgically induced variations in blood perfusion. Emphysema, air trapping, and diffusion measurements can also be performed. Embodiments of the invention can also find use in analysis/diagnosis of chronic obstructive pulmonary disease and lung volume reduction surgery, e.g., in emphysema patients.

Various applications for imaging lungs, and other gas containing objects, are also possible. For example, applications include lung-gas diffusion (or other porous media such as rock), gas-flow dynamics, lung-gas space imaging (e.g., for determining blockages or other reductions in available volume), white matter perfusion in the brain with dissolved phase gas, and airway obstructions, diameters and structures. For diffusion measurements, high (strong) and low (weak) gradients can be applied and the diffusion calculated based on the difference between the signals using the strong and weak gradients.

Still other applications include real-time or near real-time surgical applications. A surgical patient can be imaged during surgery. This allows a surgeon to see in real time what affect the surgeon's actions have. Such imaging can also be used for minimally-invasive techniques such as surgery. The imaging can be used for image-guided surgery to help guide the surgeon's actions, or to guide equipment, including automated equipment, such as laser scalpels and ablation and cauterization devices (e.g., stereo ultrasound ablation devices). Patient's can also be imaged just before and/or just after surgery. Thus, a subject can be checked for changes in the subject's condition and/or the current location of abnormalities or other areas of interest in the subject. The subject's resulting condition can be determined in the same "session" as the surgery, without requiring the typical delays of having the patient visit a special MRI center, and then attend a follow-up visit that may be weeks after the surgery or other procedure.

Other applications include, but are not limited to: identification and assessment of the presence or absence and/or severity of cardiac ischemias and/or infarcts; localization and assessment of thrombi and plaques; determination of "therapeutic windows: administering heparin, vasodilators, antihypertensive agents, calcium antagonists and the like, e.g., in reversible focal ischemia; monitoring or other induced vasodilator effects; detection and quantitative evaluation of the severity of ischemias; monitoring the vasodilatory or vasocontractory effects of a physiologically active substance; and monitoring surgically induced blood perfusion variations.

Still other applications include assessment of cerebral perfusion in following induced sabarachnoid hemorrhage or in conditions marked by brain dysfunction, e.g., in connection with acute severe symptomatic hypoantremia; evaluation of new therapies, e.g., in the treatment of cerebral vasospasm (including but not limited to, antithrombolytic therapies, calcium channel blockers, anti-inflammatory therapies, angioplasty, and the like); assessment of the presence or absence and/or severity of ischemia in large tissue masses; assessment of the relationship between blood metabolites and cerebral perfusion in cerebral ischemia associated with acute liver failure, e.g., for the treatment of Alzheimer's disease; evaluation of new therapies for stroke, including but not limited to, t-PA, aspirin antiphospholipids, lupus anticoagulants, antiphospholipid antibodies, and the like; evaluation of risk factors for stroke, e.g., serum lipid levels; evaluation of induced brain hypothermia on cerebral perfusion during neurosurgery, e.g., for stroke; evaluation of the effects of age on cerebral perfusion, e.g., to study lacunar infarcts; and assessment of narcotics, e.g., cocaine, amphetamines, ethanol, and the like, on the ischemic brain.

Embodiments of the invention are useful for both veterinary and medical applications. Such applications include diagnostic evaluation and/or treatment of subjects, in particular human subjects, because embodiments of the invention may be safer (e.g., less toxic) than methods known in the art (e.g., radioactive methods). Embodiments of the invention will be more readily accepted because they avoid radioactivity or toxic levels of chemicals or other agents. Subjects 46 can be any animal subject, e.g., humans, canines, felines, bovines, caprines, ovines, equines, rodents, procines, and/or lagomorphs.

Non-animal subjects are also acceptable and useful for a variety of applications. For example, rock samples can be imaged, e.g., for oil well logging. Rock porosity and diffusion can be measured. Using hyperpolarized gases can be much faster than current techniques. Also, polymers, filaments, and gels can be analyzed if the materials can absorb or otherwise retain hyperpolarized gas.

What is claimed is:

1. A method of imaging using magnetic resonance, the method comprising:
    administering hyperpolarized noble gas to a subject in a region to be imaged;
    applying a magnetic field of a magnitude between about 0.0001 Tesla and about 0.1 Tesla to the subject at least in the region of the subject to be imaged;
    detecting a spatial distribution of magnetic resonance signals of the hyperpolarized noble gas in the subject; and
    producing a representation of the spatial distribution.

2. The method of claim 1 wherein the noble gas is $^3$Helium.

3. The method of claim 1 wherein the noble gas is $^{129}$Xenon.

4. The method of claim 1 further comprising applying a gradient to the region to be imaged, the gradient having a smoothly varying waveform of amplitude with respect to time.

5. The method of claim 4 further comprising filtering low frequency components of the gradient before applying the gradient to the region to be imaged.

6. The method of claim 1 wherein the subject is alive.

7. The method of claim 1 wherein the subject is inanimate.

8. The method of claim 1 wherein the region of the subject is disposed within an interior volume of a conductive member.

9. The method of claim 1 wherein the region of the subject comprises a portion of a brain of the subject.

10. The method of claim 1 wherein the subject includes at least one of an electrical device, a magnetic device, and an electrically conductive member.

11. The method of claim 10 wherein the electrical device is a pacemaker.

12. The method of claim 1 wherein the hyperpolarized gas comprises Helium and Xenon and wherein the method further comprises differentially imaging the Helium and Xenon gases.

13. The method of claim 1 wherein the applied magnetic field is less than 0.017 Tesla.

14. The method of claim 13 further comprising:
    exciting the hyperpolarized noble gas by applying at least one RF pulse to the subject; and
    evaluating a signal produced by the hyperpolarized gas in response to the at least one RE pulse to determine at least one of:
    ventilation in the subject, at least one characteristic of lung gas in the subject, and perfusion in the subject.

15. The method of claim 14 wherein the at least one RF pulse comprises at least two RF pulses and the method further comprises evaluating signals produced in response to the RF pulses to determine lung gas flow.

16. The method of claim 15 wherein the lung gas flow is determined in real time.

17. The method of claim 13 further comprising exciting the hyperpolarized noble gas by applying at least one RF pulse to the subject using at least one of a RARE pulse sequence, a gradient echo pulse sequence, and EPI pulse sequence, a DANTE pulse sequence.

18. The method of claim 17 wherein the gradient echo pulse sequence uses centric coding.

19. The method of claim 17 wherein the DANTE pulse sequence comprises a Jump Return pulse sequence.

20. The method of claim 13 further comprising sweeping the magnetic field using a continuous wave.

21. The method of claim 13 further comprising exciting the hyperpolarized noble gas by applying at least one RF pulse to the subject using a spin echo pulse sequence.

22. The method of claim 13 further comprising:
    exciting the hyperpolarized noble gas by applying a plurality of RF pulses to the subject; and
    evaluating a signal produced in response to the RF pulses to determine blood flow in the subject.

23. The method of claim 22 wherein the signal produced in response to the RF pulse is produced by carrier agents mixed with the hyperpolarized gas.

24. The method of claim 13 wherein the at least one RF pulse has a large flip angle.

25. The method of claim 24 wherein the flip angle is about 90 degrees.

26. The method of claim 25 wherein the exciting selectively excites dissolved phase hyperpolarized $^{129}$Xe.

27. An imaging system comprising:
    a magnetic field apparatus configured to produce a static magnetic field between about 0.0001 Tesla and about 0.1 Tesla;
    a gas delivery apparatus adapted to store and deliver hyperpolarized noble gas to a region of a subject to be imaged;
    an RF transmitting arrangement configured to provide RF pulses to at least the region of the subject to be imaged;

a detecting arrangement configured detect signals produced by hyperpolarized gas in response to receiving an RF pulse in a static magnetic field between about 0.0001 Tesla and about 0.1 Tesla; and a processor adapted to receive indications of the signals from the detecting arrangement and to process the indications into a representation of a spatial distribution of the hyperpolarized noble gas delivered to the subject.

28. The system of claim 27 wherein the RF transmitting arrangement and the detecting arrangement comprise a common coil arrangement.

29. The system of claim 27 wherein the RF transmitting arrangement comprises a first coil arrangement and the detecting arrangement comprises a second coil arrangement disposed substantially perpendicular to the first coil arrangement.

30. The system of claim 27 wherein the noble gas is $^3$Helium.

31. The system of claim 27 wherein the noble gas is $^{129}$Xenon.

32. The system of claim 27 further comprising an electrically conductive shield disposed between the magnetic field apparatus and the subject.

33. The system of claim 27 further comprising a gradient arrangement configured to provide gradients to the subject.

34. The system of claim 33 wherein the gradient arrangement is configured to provide gradients having smoothly varying waveforms of amplitude with respect to time in response to control signals from a controller.

35. The system of claim 34 wherein the gradient arrangement comprises a gradient filter configured to filter low frequency components of the gradients.

36. The system of claim 34 wherein the gradient arrangement further comprises a gradient amplifier coupled to a gradient coil through the gradient filter, and wherein the gradient filter is disposed at a point where a line coupling the gradient amplifier to the gradient coil enters a shielded room.

37. The system of claim 27 wherein the RF transmitting arrangement comprises an RF coil and the system further comprises an electrically conductive RF coil shield configured to contain the RF coil and enclosing a volume approximately equal to, but larger than, a volume partially enclosed by the RF coil.

38. The system of claim 27 wherein the magnetic field apparatus has a substantially open configuration.

39. An imaging system comprising:

means for applying a static magnetic field between about 0.0001 Tesla and about 0.1 Tesla to a subject;

a gas delivery apparatus adapted to store and deliver hyperpolarized noble gas to a region of the subject to be imaged;

an RF transmitting arrangement configured to provide RF pulses to at least the region of the subject to be imaged;

means for detecting signals produced by hyperpolarized gas in response to receiving an RF pulse in a static magnetic field between about 0.0001 Tesla and about 0.1 Tesla; and a processor adapted to receive indications of the signals from the detecting arrangement and to process the indications into a representation of a spatial distribution of the hyperpolarized noble gas delivered to the subject.

40. A method of imaging using magnetic resonance, the method comprising:

administering hyperpolarized noble gas to a subject in a region to be imaged;

applying a magnetic field of a magnitude below 0.0001 Tesla to the subject at least in the region of the subject to be imaged;

detecting a spatial distribution of magnetic resonance signals of the hyperpolarized noble gas in the subject; and producing a representation of the spatial distribution.

* * * * *

UNITED STATES PATENT AND TRADEMARK OFFICE
CERTIFICATE OF CORRECTION

| | |
|---|---|
| PATENT NO. | : 6,845,262 B2 |
| DATED | : January 18, 2005 |
| INVENTOR(S) | : Mitchell S. Albert, Dilip Balamore and Arvind K. Venkatesh |

It is certified that error appears in the above-identified patent and that said Letters Patent is hereby corrected as shown below:

Column 22,
Line 20, "RE" should read -- RF --.

Signed and Sealed this

Twentieth Day of September, 2005

JON W. DUDAS
*Director of the United States Patent and Trademark Office*